(12) United States Patent
Sasaki et al.

(10) Patent No.: US 10,286,425 B2
(45) Date of Patent: May 14, 2019

(54) SUBSTRATE CLEANING METHOD AND SUBSTRATE CLEANING APPARATUS

(71) Applicant: SCREEN Holdings Co., Ltd., Kyoto (JP)

(72) Inventors: Yuta Sasaki, Kyoto (JP); Yosuke Hanawa, Kyoto (JP); Katsuhiko Miya, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 284 days.

(21) Appl. No.: 15/222,124

(22) Filed: Jul. 28, 2016

(65) Prior Publication Data

US 2017/0043379 A1 Feb. 16, 2017

(30) Foreign Application Priority Data

Aug. 14, 2015 (JP) .................. 2015-160075

(51) Int. Cl.
*B08B 3/00* (2006.01)
*B08B 3/12* (2006.01)
*C11D 11/00* (2006.01)
*H01L 21/67* (2006.01)

(52) U.S. Cl.
CPC .............. *B08B 3/12* (2013.01); *B08B 3/00* (2013.01); *C11D 11/007* (2013.01); *C11D 11/0047* (2013.01); *H01L 21/6708* (2013.01); *H01L 21/67028* (2013.01); *H01L 21/67051* (2013.01)

(58) Field of Classification Search
CPC ......... B08B 3/00; B08B 3/12; C11D 11/0047; C11D 11/007; H01L 21/67028; H01L 21/67051; H01L 21/6708
USPC ....................................... 134/95.3, 184, 902
See application file for complete search history.

(56) References Cited

U.S. PATENT DOCUMENTS

| | | | |
|---|---|---|---|
| 5,858,106 A | 1/1999 | Ohmi et al. | 134/1 |
| 9,259,758 B2 | 2/2016 | Emoto et al. | 427/240 |
| 2006/0222315 A1 | 10/2006 | Yoshida | 385/147 |
| 2012/0045581 A1 | 2/2012 | Kimura et al. | 427/248.1 |

(Continued)

FOREIGN PATENT DOCUMENTS

JP H11-260778 9/1999
JP H11-300300 11/1999

(Continued)

OTHER PUBLICATIONS

Office Action dated Sep. 27, 2017 issued in corresponding Korean Patent Application No. 10-2016-0094861 without English translation.

*Primary Examiner* — Levon J Shahinian
(74) *Attorney, Agent, or Firm* — Ostrolenk Faber LLP

(57) ABSTRACT

After hydrophobization of surfaces of patterns, a liquid film of pure water or the like is formed on the surfaces of the substrate. At this stage, the liquid of the liquid film cannot be present between the patterns because of hydrophobization, and gas is present there. With the front surface of the substrate covered with the liquid film, a liquid to which ultrasonic waves are applied is supplied to the back surface of the substrate, whereby the back surface of the substrate is cleaned due to the cavitation collapse energy in the liquid caused by the ultrasonic waves. While collapse of cavitation occurs at the front surface of the substrate, the presence of the gas between the patterns prohibits collapse of cavitation between the patterns, the liquid film can prevent contamination while preventing collapse of the patterns, and the back surface of the substrate is cleaned favorably.

8 Claims, 19 Drawing Sheets

(56) References Cited

U.S. PATENT DOCUMENTS

| | | |
|---|---|---|
| 2012/0186607 A1 | 7/2012 | Higashijima et al. .......... 134/30 |
| 2012/0298152 A1 | 11/2012 | Yoshida ...................... 134/104.2 |
| 2014/0065295 A1 | 3/2014 | Emoto et al. ..................... 427/8 |

FOREIGN PATENT DOCUMENTS

| | | |
|---|---|---|
| JP | 2000-183012 | 6/2000 |
| JP | 2000-208458 | 7/2000 |
| JP | 2004-363453 | 12/2004 |
| JP | 2005-191587 A | 7/2005 |
| JP | 2006-286831 | 10/2006 |
| JP | 2010-027816 | 2/2010 |
| JP | 2010-287841 | 12/2010 |
| JP | 2011-071198 A | 4/2011 |
| JP | 2012-156267 A | 8/2012 |
| JP | 2013-084667 | 5/2013 |
| JP | 2014-197571 | 10/2014 |
| KR | 10-2012-0022632 | 3/2012 |

F I G. 3
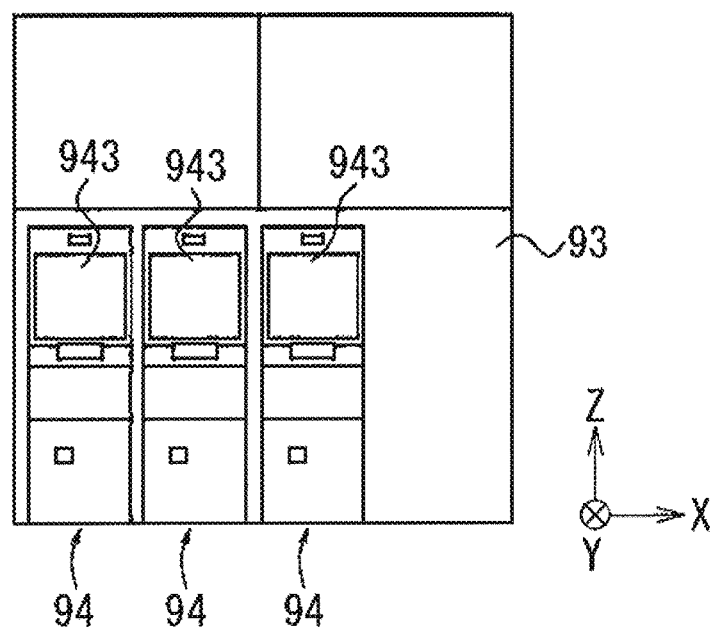

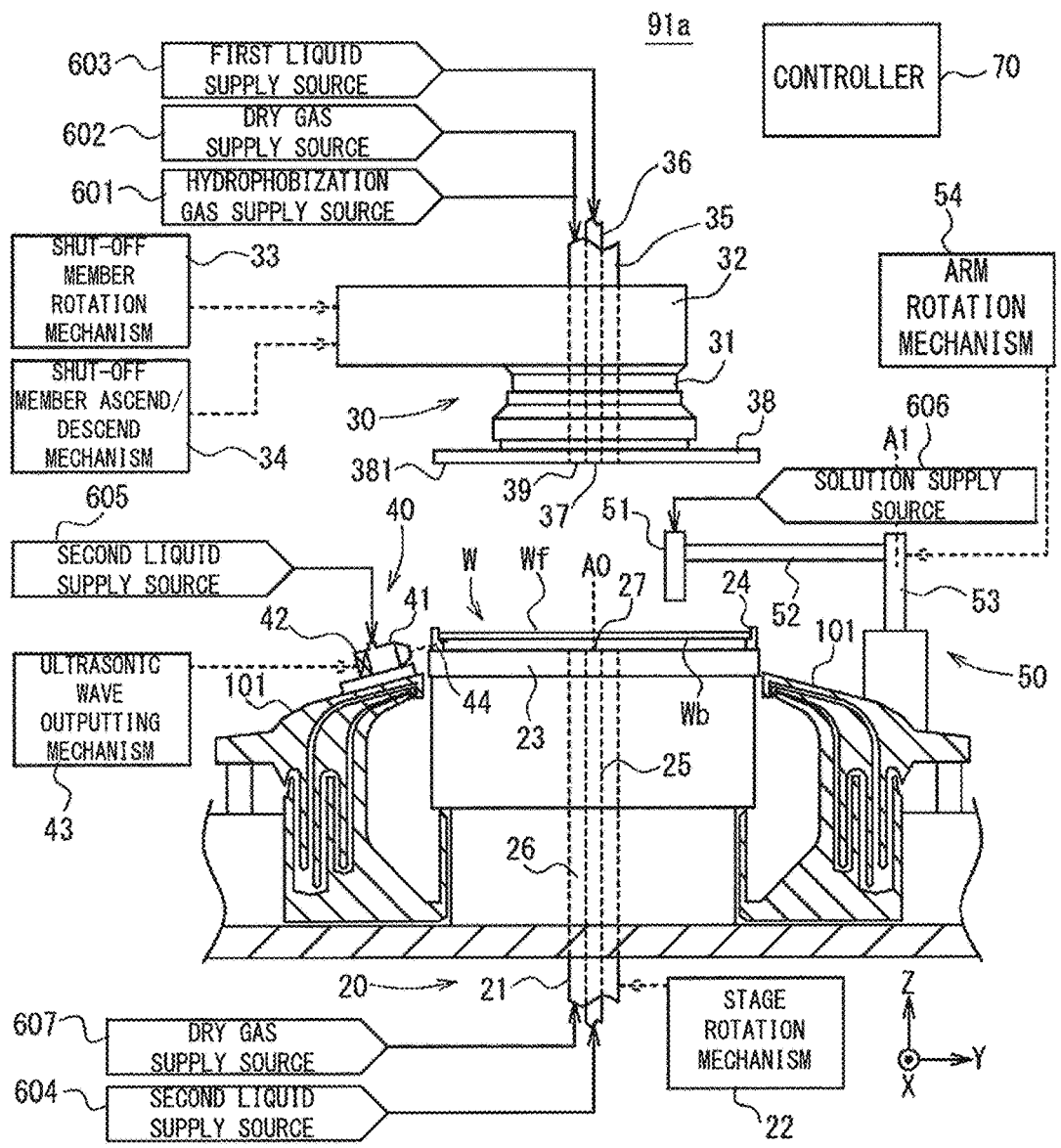
F I G. 4

F I G. 7
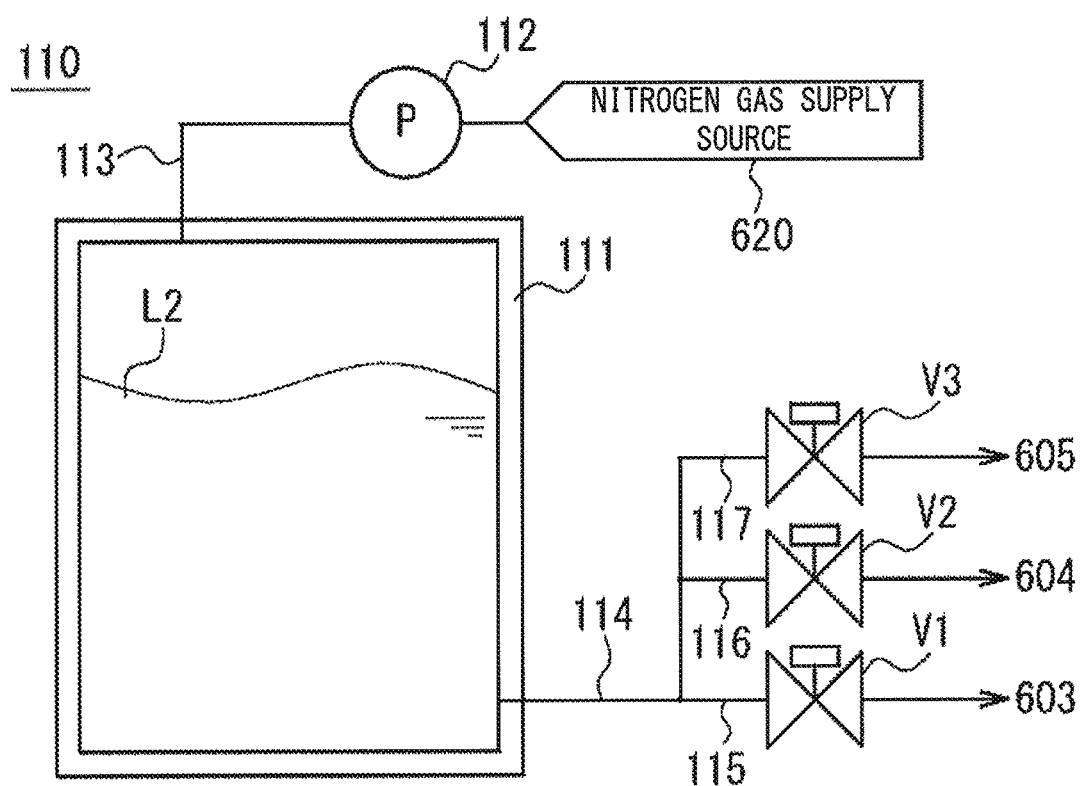

F I G. 1 0
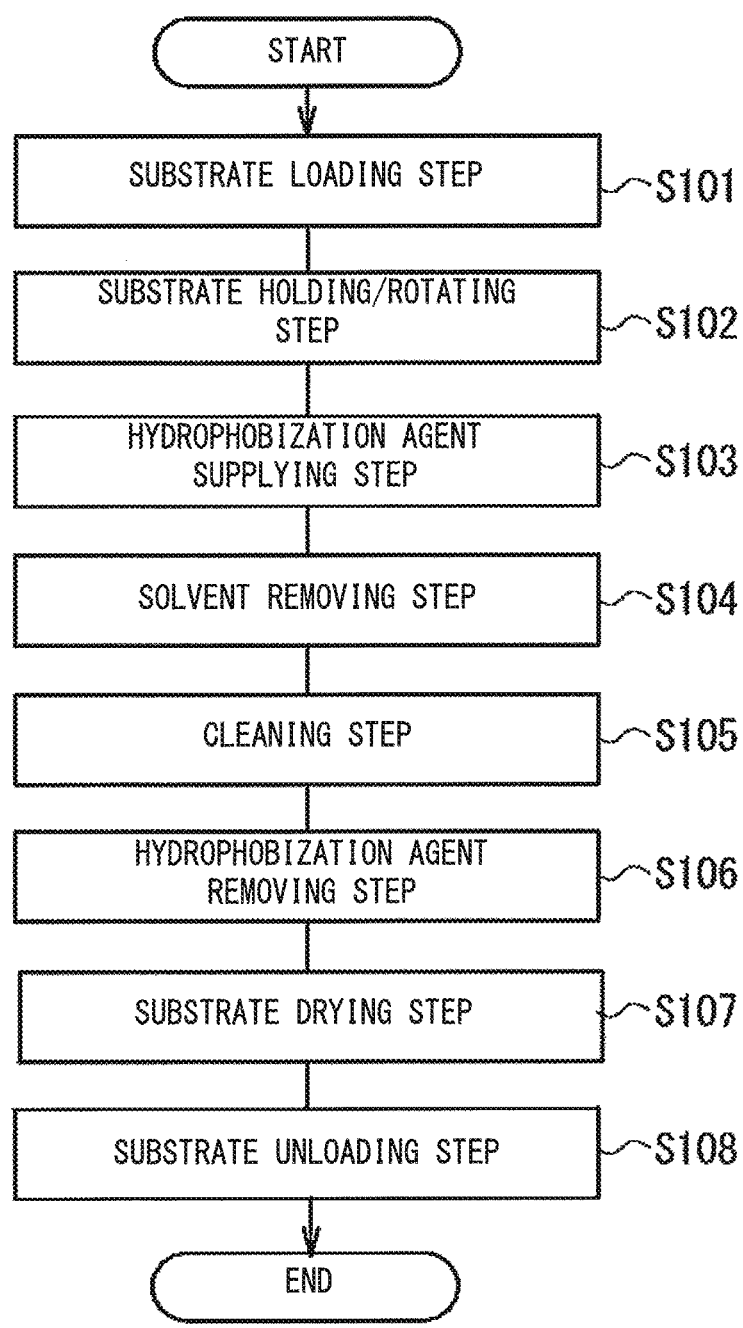

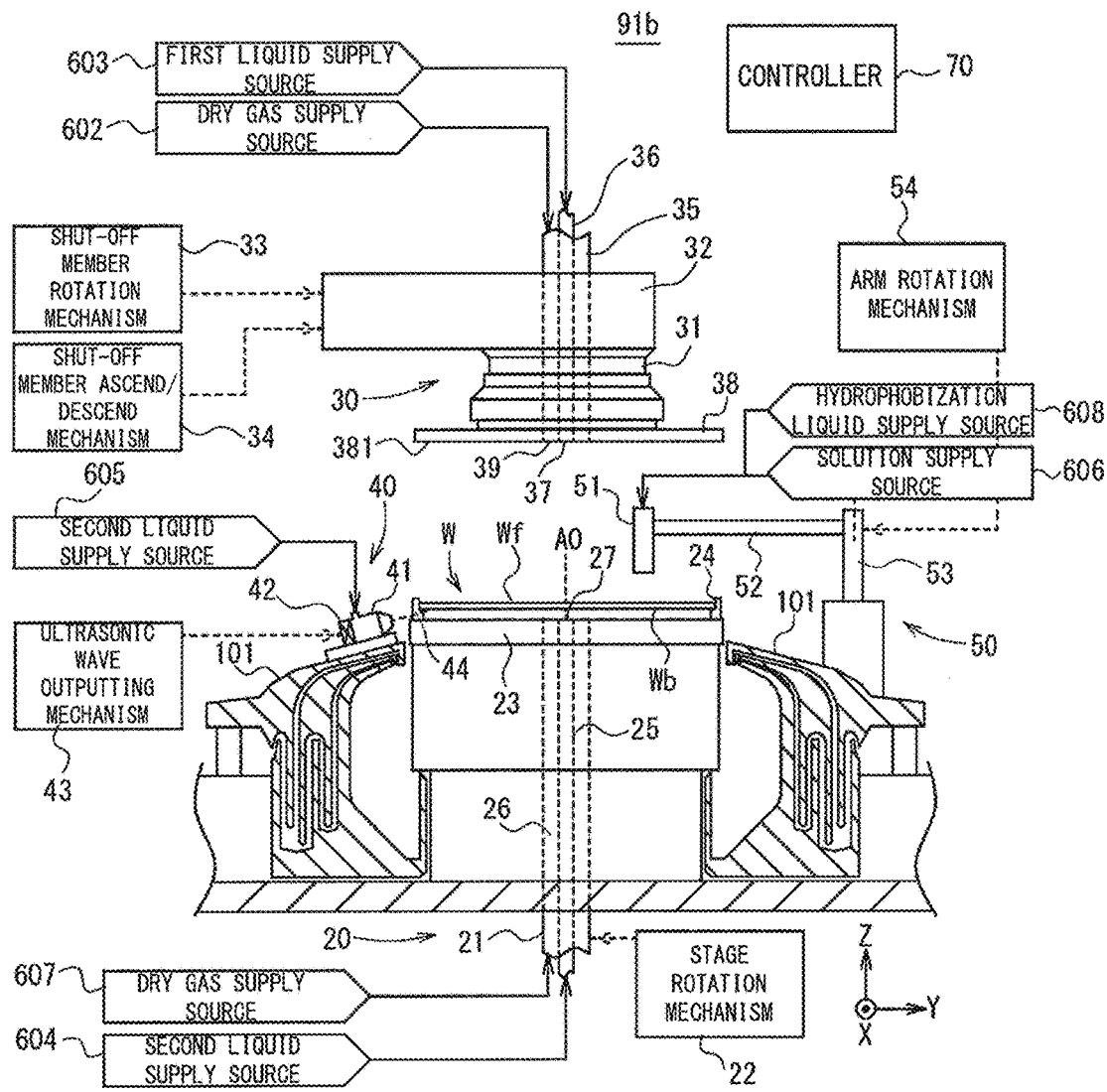
F I G. 1 4

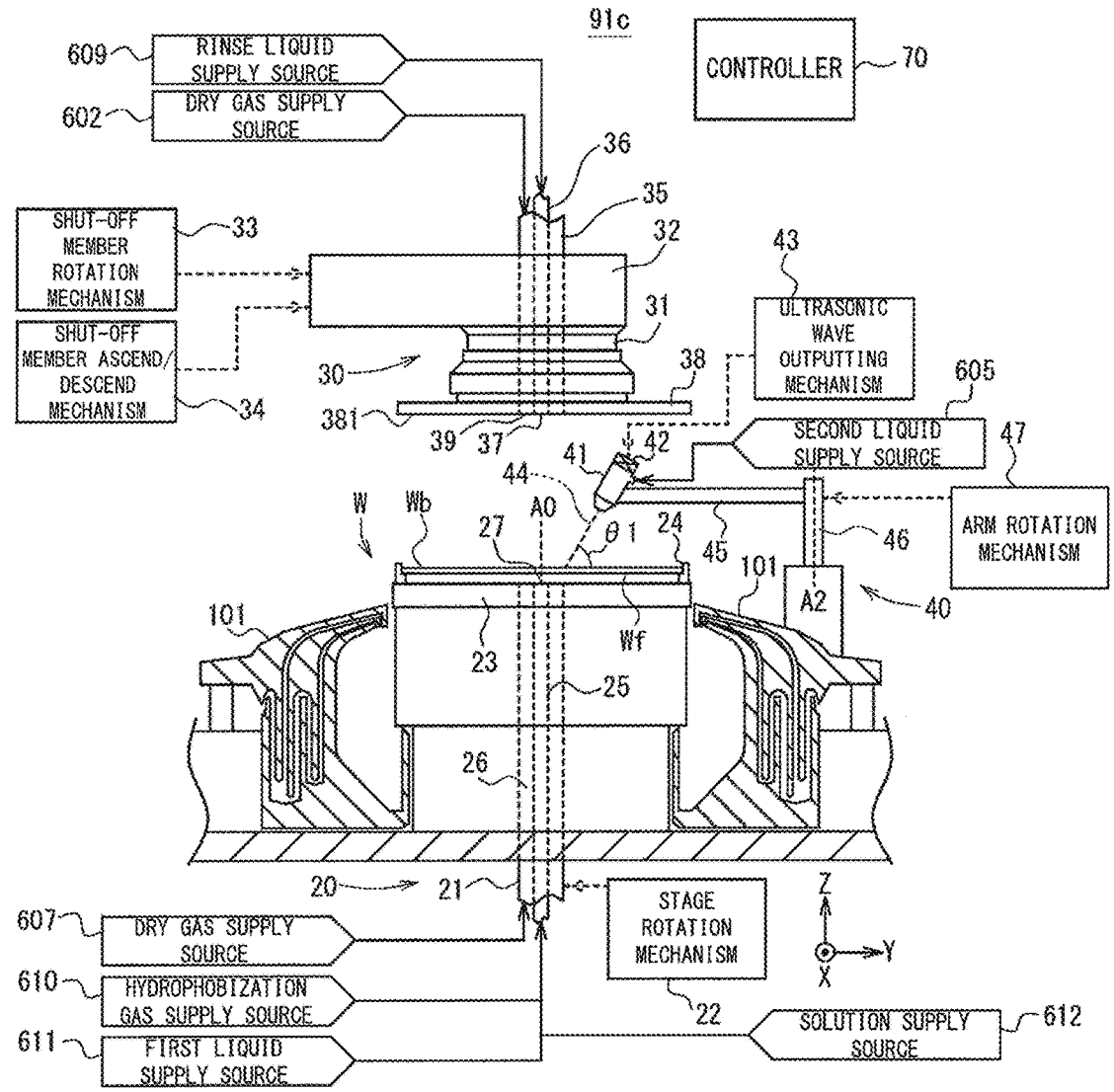
F I G. 15

F I G. 1 7
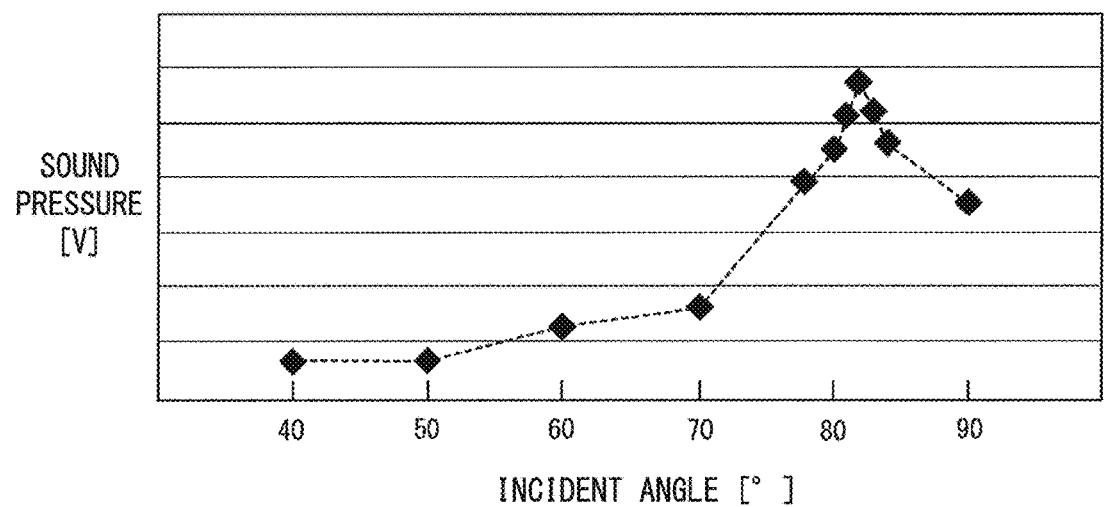

F I G. 2 0
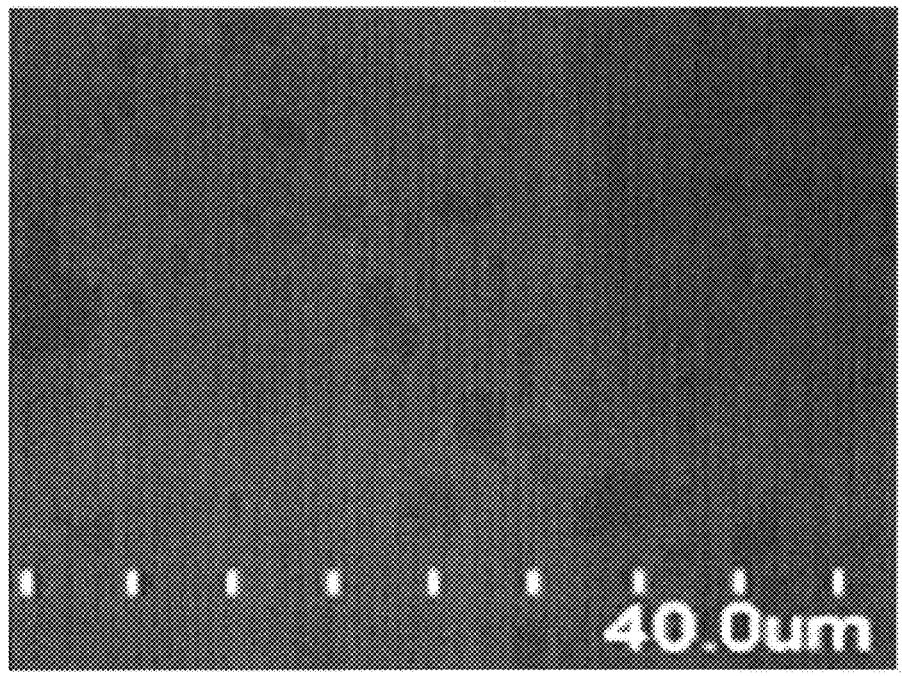
F I G. 2 1
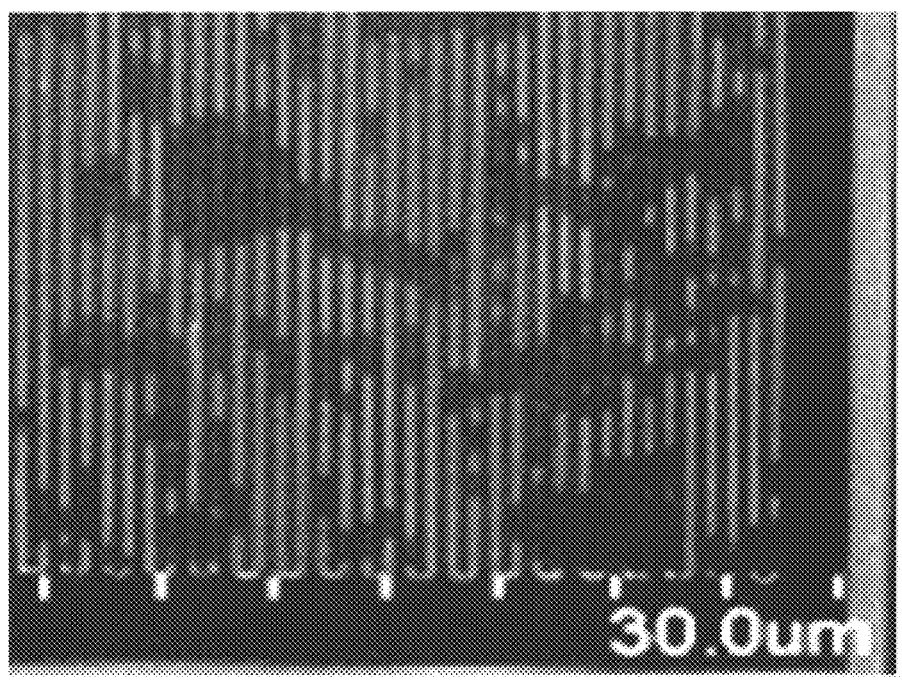

SUBSTRATE CLEANING METHOD AND SUBSTRATE CLEANING APPARATUS

CROSS REFERENCE TO RELATED APPLICATION

The disclosure of Japanese Patent Application No. 2015-160075 filed Aug. 14, 2015 including specification, drawings and claims is incorporated herein by reference in its entirety.

BACKGROUND OF THE INVENTION

1. Field of the Invention

The present invention relates to a substrate cleaning method of and a substrate cleaning apparatus for removing contaminants such as particles adhering to various types of substrates (hereinafter referred to simply as "the substrates") such as semiconductor substrates, glass substrates for photomask, glass substrates for liquid crystal display, glass substrates for plasma display, substrates for FED (Field Emission Display), substrates for optical disc, substrates for magnetic disk, substrates for magneto-optical disk and so on.

2. Description of the Related Art

A manufacturing process of electronic components such as a semiconductor device and a liquid crystal device includes a step of forming micro-patterns by repeating processing such as film deposition and etching on the front surface of the substrate. If there are particles adhering to the back surface of the substrate, the particles cause defocusing at a photolithographic step and makes it difficult to form desirable micro-patterns. Further, the substrate whose back surface carries the particles may give rise to cross contamination.

Vacuum sucking of the back surface of the substrate is often performed for transportation of the substrate, in the process particles may adhere to the back surface of the substrate. For this reason, a great number of techniques for cleaning the back surface of the substrate have been proposed. For instance, the apparatus according to JP-A-2010-27816 supplies an ultrasonic processing liquid, which is obtained by applying ultrasonic waves to a processing liquid, to the back surface of the substrate, thereby realizing ultrasonic cleaning. In an effort to prevent transmission of ultrasonic waves to the front surface of the substrate and damage upon patterns formed in the front surface of the substrate during ultrasonic cleaning, this apparatus forms a liquid film on the front surface of the substrate, freezes the liquid film and accordingly reinforces the patterns.

The apparatus according to JP-A-2010-27816 above is a cleaning apparatus which utilizes the principle of transmitting ultrasonic vibrations to a cleaning liquid and consequently generating micron-size air bubbles (cavitation bubbles) in the cleaning liquid. As powerful flows are created in the cleaning liquid owing to movements such as growth and collapse of cavitation bubbles, the particles adhering to the front surface of the substrate are released from the front surface of the substrate and washed away together with the cleaning liquid, whereby the front surface of the substrate is cleaned.

Like JP-A-2010-27816, JP-A-2013-84667 aims at suppressing damage to patterns which are formed on the front surface of the substrate, and discloses a technique which contains the substrate inside a housing section, supply a deaerated processing liquid to inside the housing section and apply ultrasonic vibrations on the processing liquid to thereby entirely clean the principal surface and the back surface of the substrate. A reduction of the dissolved gas concentration in the processing liquid decreases the amount of cavitation bubbles which are generated and suppresses damage to the patterns of the substrate.

Further, as other substrate cleaning technique using an ultrasonic processing liquid, JP-A-2004-363453 discloses an apparatus which supplies an ultrasonic processing liquid, on which ultrasonic vibrations are applied, to the front surface of the substrate from a nozzle while rotating the substrate to thereby clean the substrate. This apparatus moves the nozzle in a predetermined direction while maintaining the angle of the axis line of the nozzle with respect to the front surface and a peripheral area of the substrate. This blows the ultrasonic processing liquid toward not only the front surface of the substrate but the peripheral area of the substrate as well, and achieves ultrasonic cleaning.

Known substrate drying techniques include the technique according to JP-A-2014-197571 which hydrophobize the front surface of the substrate to reduce the contact angle between patterns and a liquid which fills the areas between the patterns and decrease force which acts upon the patterns during cleaning of the substrate to thereby discourage collapse of the patterns.

SUMMARY OF THE INVENTION

During cleaning of the other principal surface (back surface) of the substrate having one principal surface (front surface) on which patterns are formed, it is necessary to suppress damage such as collapse of the patterns and favorably clean the other principal surface as well. Over the recent years in which patterns are further miniaturized, the sizes of particles which must be removed from the substrate have become miniaturized, and therefore, it is necessary to remove fine particles from the other principal surface as well. Further, because of the tendency that the smaller the sizes of the particles are, the stronger the adhesion to the substrate is, it is necessary that detergency for removal of the particles (that is, the strength of physical force applied on the particles which is required in order to release the particles from the principal surface of the substrate) is stronger in order to remove the fine particles without fail.

The apparatus described in JP-A-2013-84667 supplies a deaerated processing liquid, applies ultrasonic vibrations on the processing liquid and accordingly cleans the principal surface and the back surface of the substrate entirely. This suppresses damage upon patterns of the substrate. However, since the back surface is cleaned with the deaerated processing liquid as the principal surface is, as compared with where the processing liquid is not deaerated, detergency upon the back surface deteriorates and cannot remove the fine particles from the back surface, and hence, a desired particle removal rate may not be attained.

In this regard, as JP-A-2010-27816 discloses direct supplying of a liquid, on which ultrasonic vibrations have been applied, to the back surface of the substrate from an ultrasonic cleaning nozzle, it is possible to sufficiently remove particles from such areas of the back surface of the substrate which directly receive the supply of the liquid from the ultrasonic cleaning nozzle. However, the apparatus according to JP-A-2010-27816 must clean the back surface of the substrate after execution and completion of processing of freezing the liquid film so as to prevent damage upon the patterns. This necessitates supplying of cooling gas to the liquid film for the processing of freezing, it is inevitable to increase the running costs.

The invention was developed in light of the problem described above, and an object thereof is to provide a substrate cleaning method and a substrate cleaning apparatus which can prevent patterns on the front surface of the substrate from collapse owing to cavitation and execute favorable cleaning process to the back surface of the substrate as well by ultrasonic cleaning process which removes contaminants adhering to the back surface of the substrate by ultrasonic waves and clean the substrate.

An aspect of a substrate cleaning method according to the present invention comprises: a hydrophobization step of hydrophobizing surfaces of patterns formed on one principal surface of a substrate; an one-principal surface liquid film forming step of forming a liquid film of a first liquid on one principal surface after the hydrophobization step; and a cleaning step of cleaning the other principal surface of the substrate by supplying an ultrasonic wave-applied liquid, which is obtained by applying ultrasonic waves upon a second liquid, to the other principal surface in a condition that one principal surface is covered with the liquid film.

An aspect of a substrate cleaning apparatus according to the present invention comprises: a hydrophobizer which hydrophobizes surfaces of the patterns formed on one principal surface of a substrate; an one-principal surface liquid film former which supplies a first liquid to one principal surface and forms a liquid film of the first liquid; an ultrasonic wave-applied liquid supplier which supplies an ultrasonic wave-applied liquid, which is obtained by applying ultrasonic waves upon a second liquid, to the other principal surface of the substrate; and a controller which controls the hydrophobizer, the one-principal surface liquid film former and the ultrasonic wave-applied liquid supplier, wherein the controller has a memory part which stores a program for executing a cleaning operation in which after hydrophobization of the surfaces of the patterns by the hydrophobizer, in a condition that the one-principal surface liquid film former has covered one principal surface with the liquid film, the ultrasonic wave-applied liquid supplier supplies the ultrasonic wave-applied liquid to the other principal surface and the other principal surface is cleaned.

According to the invention, in the ultrasonic cleaning processing of cleaning the substrate by ultrasonic cleaning to remove the contamination adhering to the other principal surface of substrate having one principal surface on which patterns are formed, it is possible to prevent collapse of the patterns owing to cavitation and favorably clean the other principal surface of the substrate.

Further, according to the invention, ultrasonic cleaning of cleaning the substrate by removing the contamination adhering to the other principal surface is executed with ultrasonic wave is executed in the condition that the liquid film of the first liquid is formed on one principal surface, and therefore, it is possible to prevent contamination of one principal surface including the patterns during the ultrasonic cleaning processing.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 3 is a side view from the arrow B2 of FIG. 1.

FIG. 4 is a schematic view showing the structure of the cleaning units according to first embodiment.

FIG. 7 is a drawing showing the structure of the processing liquid supplier according to first embodiment.

FIG. 10 is a flow chart showing the operation of cleaning unit of FIG. 4.

FIG. 14 is a drawing showing the structure of the cleaning unit according to the second embodiment.

FIG. 15 is a drawing showing the structure of the cleaning unit according to the third embodiment.

FIG. 17 is a drawing showing the relationship between the incident angle of ultrasonic wave-applied liquid from the nozzle to the front surface of the substrate and sound pressure at the back surface of the substrate.

FIG. 20 is a drawing showing the results of the comparison experiments of FIG. 18.

FIG. 21 is a drawing showing the results of the comparison experiments of FIG. 18.

DETAILED DESCRIPTION OF THE PREFERRED EMBODIMENTS

Figure 1:
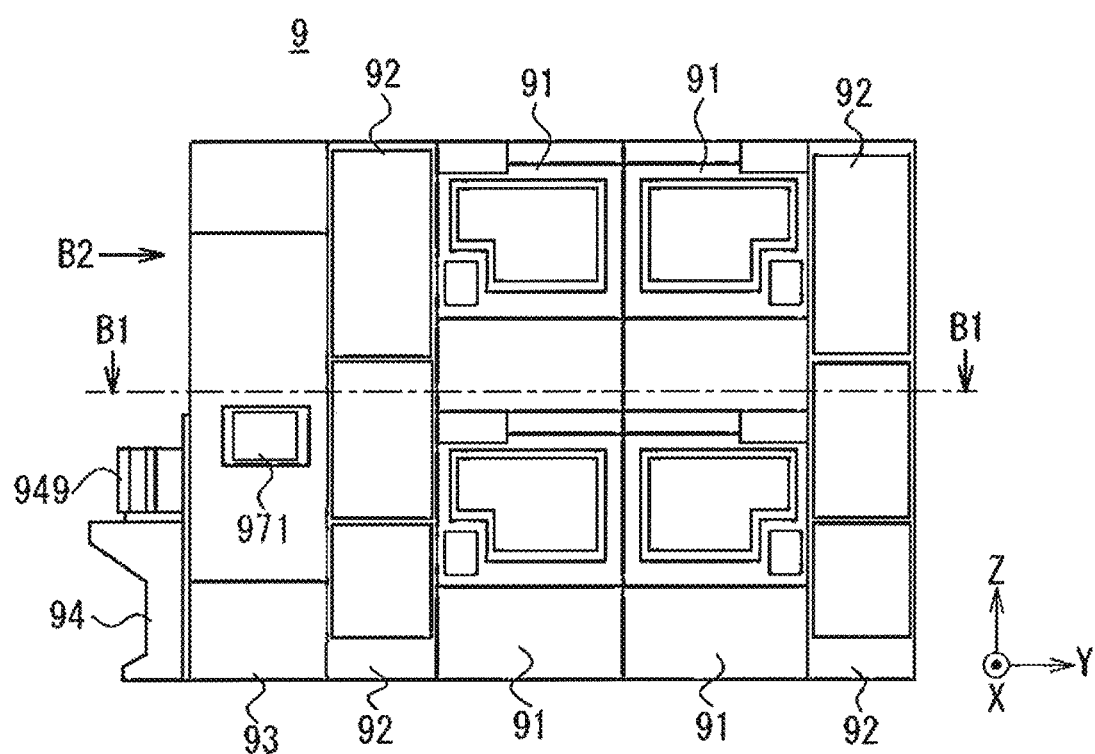
FIG. 1 is a front view showing skeleton structure of the substrate cleaning apparatus according to the invention.

The substrates referred to below include various types of substrates such as semiconductor substrates, glass substrates for photomask, glass substrates for liquid crystal display, glass substrates for plasma display, substrates for FED (Field Emission Display), substrates for optical disc, substrates for magnetic disk, substrates for magneto-optical disk, substrates for solar battery, and so on.

A description will now be given below on an example of the substrate where circuit patterns of concave and convex sections and the like (hereinafter referred to as "the pattern") are formed on only one principal surface. The principal surface on which the patterns are formed is referred to as "the front surface" and the opposite-side principal surface on which the patterns are not formed is referred to as "the back surface." Further, the surface of the substrate which is directed toward below is referred to as "the bottom surface" and the surface of the substrate which is directed toward above is referred to as "the top surface." The first and the second embodiments refer to the top surface as the front surface, while the third embodiment refers to the top surface as the back surface.

In the description below, the substrate is approximately circular and has a notch or orientation flat at a part of the periphery. While those having the diameter not less than 100 mm and not more than 450 mm are usually used as the substrates, the shape and the size of the substrates are not limited to these in the embodiments of the invention.

In the description below, an ordinary temperature means the temperature of the atmosphere in a factory where the substrate cleaning apparatus according to the invention is installed. In the embodiments below, the ordinary temperature is within the range of 20 degrees Celsius±15 degrees Celsius.

The embodiments of the invention will now be described, taking a substrate cleaning apparatus which is used for processing of a semiconductor substrate as an example while referring to the drawings. The invention is not limited to processing of a semiconductor substrate but is applicable also to processing of various types of substrates such as a glass substrate for liquid crystal display.

First Embodiment

Figure 2:
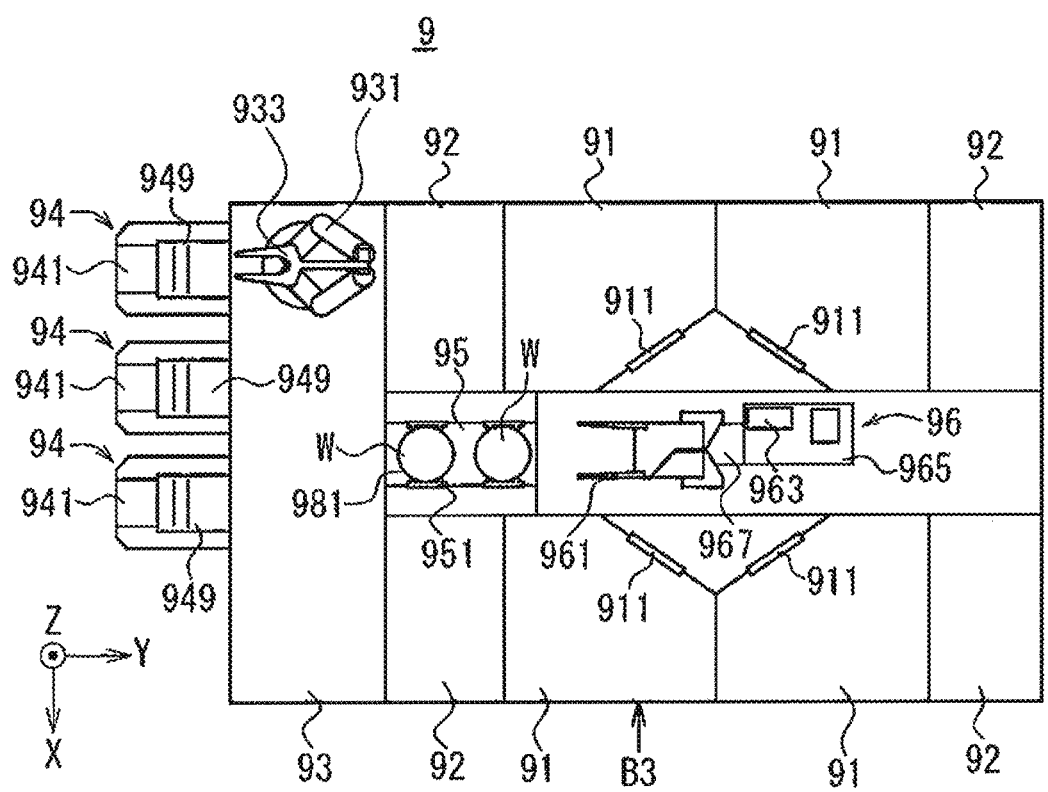
FIG. 2 is an arrow cross-sectional view taken along the line B1-B1 of FIG. 1.

FIGS. 1, 2 and 3 are drawings which show the schematic structure of the substrate cleaning apparatus 9 according to the invention. FIG. 1 is a front view of the substrate cleaning apparatus 9, and FIG. 2 is an arrow cross-sectional view of the substrate cleaning apparatus 9 shown in FIG. 1 taken along the line B1-B1. FIG. 3 is a side view of the substrate cleaning apparatus 9 shown in FIG. 1 as viewed from the arrow B2. This apparatus is a substrate cleaning apparatus of the single wafer processing type which is used for cleaning processing which is for removing contaminants such as particles (hereinafter referred to as "the particles and the like") adhering to the substrates W which may be semiconductor substrates and so on (hereinafter referred to simply as "the substrates W").

For clear presentation of the directions, each drawing shows the coordinate system in which the Z axis is the vertical direction and the XY plane is the horizontal plane. In each coordinate system, the direction to which the tip of the arrow directs is the + (plus) direction and the opposite direction is the − (minus) direction.

<1-1. Overall Structure of the Substrate Cleaning Apparatus>

The substrate cleaning apparatus 9 comprises an opener 94 seating an FOUP (Front Open Unified Pod) 949 containing twenty-five substrates W for instance, an indexer unit 93 which unloads the unprocessed substrate W from the FOUP 949 which is on the opener 94 and returns the processed substrate W to FOUP 949, a shuttle 95 which transfers the substrate W between the indexer unit 93 and a center robot 96, a cleaning unit 91 which contains the substrate W carried by center robot 96 and cleans it, and a fluid box 92 which houses pipes, valves and the like for a liquid, gas, etc. supplied to the cleaning unit 91.

The planar arrangement of these will be first described with reference to FIG. 2. There are a plurality of (three in this embodiment) openers 94 at one end of the substrate cleaning apparatus 9 (i.e., at the far-left in FIG. 2). The indexer unit 93 is next to the openers 94 on the right-hand side (+Y side) in FIG. 2. The shuttle 95 is located at around the center of the indexer unit 93 along the X direction and next to the indexer unit 93 on the right-hand side (+Y side) in FIG. 2, and the center robot 96 is located next to the shuttle 95 on the right-hand side (+Y side) in FIG. 2 so that the center robot is aligned to the shuttle 95 in the +Y direction. The indexer unit 93, the shuttle 95 and the center robot 96 are thus arranged to make two lines which are orthogonal to each other.

The cleaning units 91 and the fluid boxes 92 are disposed on the upper side (−X side) and the lower side (+X side) in FIG. 2 of the shuttle 95 and the center robot 96 which are side by side along the +Y direction. That is, the fluid box 92, the cleaning unit 91, the cleaning unit 91 and the fluid box 92 are arranged in this order next to the right-hand side (+Y side) of the indexer unit 93 in FIG. 2 on the upper side (−X side) or the lower side (+X side) in FIG. 2 to the shuttle 95 and the center robot 96 in FIG. 2.

An operation part 971 of a controller 70 which will be described in detail later is disposed to the side surface of the indexer unit 93 at the +X side (the lower side in FIG. 2) (See FIG. 1).

The openers 94 will now be described. The opener 94 has a seating surface 941 on top of which the FOUP 949 is disposed and an open/close mechanism 943 (FIG. 3) which is opposed to the front of the FOUP 949 (the right-hand side (+Y side) surface of the FOUP 949 in FIGS. 1 and 2) and which opens and closes a lid part (not shown) which is at the front of the FOUP 949.

The FOUP 949 delivered by an automatic transportation vehicle or the like from outside the substrate cleaning apparatus 9 is disposed on the seating surface 941 of the opener 94, and the open/close mechanism 943 opens the lid part. This allows an indexer robot 931 of the indexer unit 93 described later to unload the substrate W which is inside the FOUP 949 and load the substrate W into inside the FOUP 949.

Next, the indexer unit 93 will be described. The indexer unit 93 is equipped with the indexer robot 931 which has two sets of hands 933 arranged one above the other along the Z axis direction and takes out the unprocessed substrates W one by one from the FOUP 949, loads the processed substrates W one by one into the FOUP 949, and transfers the substrate W to or from the shuttle 95. The indexer robot 931 can move freely horizontally in the X axis direction, move freely up and down in the Z axis direction and can rotate about the Z axis.

The shuttle 95 will now be described. The shuttle 95 comprises two sets of hands 951 which are arranged one above the other along the Z axis direction and hold positions which are close to the periphery of the substrate W on the upper side (−X side) and the lower side (+X side) in FIG. 2 and do not interfere with the hands 933 of the indexer robot 931 and hands 961 of the center robot 96 described later, and comprises a horizontal movement mechanism (not shown) which moves the two sets of hands 951 independently of each other horizontally along the Y axis direction.

The shuttle 95 can transfer the substrate W to or from both the indexer robot 931 and the center robot 96. That is, when the hands 951 are moved to the left side (−Y side) in FIG. 2 by the horizontal movement mechanism not shown, the substrate W can be transferred to or from the hands 933 of the indexer robot 931, and when the hands 951 are moved to the right-hand side (−Y side) in FIG. 2, the substrate W can be transferred to or from the hands 961 of the center robot 96.

Next, the center robot 96 will be described. The center robot 96 comprises the two sets of hands 961 which are arranged one above the other along the Z axis direction, hold the substrates W one by one and transfer the substrate W to or from the shuttle 95 or the cleaning units 91, an ascend/descend axis 963 which is elongated along the vertical direction (the Z axis direction) and serves as an axis along which the hands 961 move vertically, an ascend/descend mechanism 965 which moves the hands 961 up and down, and a rotation mechanism 967 which rotates the hands 961 about the Z axis. The center robot 96 can ascend and descend along the ascend/descend axis 963 in the Z axis direction, and the hands can rotate about the Z axis by the rotation mechanism 967.

The side walls described later of the cleaning units 91 which are opposed to the center robot 96 have openings through which the substrates W are loaded into and unloaded from the cleaning units 91 by the stretched hands 961 of the center robot 96. Further, there are shutters 911 to maintain the cleanliness of the atmosphere inside the cleaning units 91 by closing the openings when the center robot 96 doesn't transfer the substrates W to or from the cleaning units 91.

As shown in FIG. 1, the cleaning units 91 and the fluid boxes 92 are stacked one above the other in the two layers. Therefore, eight cleaning units 91 and eight fluid boxes 92 are installed within the substrate cleaning apparatus 9 according to this embodiment.

The number of the cleaning units 91 and that of the fluid boxes 92 are not limited to eight to exercise the invention: the invention can be exercised with more of them or less of them.

Now, a description will be given on the procedure of transporting the substrates W using the indexer robot 931, the shuttle 95 and the center robot 96. The FOUP 949 delivered by an automatic transportation vehicle or the like from outside the substrate cleaning apparatus 9 is set on the seating surface 941 of the opener 94, and the lid part is opened by the open/close mechanism 943. Using the lower hands 933, the indexer robot 931 takes out one substrate W from a predetermined position of the FOUP 949. Following this, the indexer robot 931 moves to in front of the shuttle 95 (near the center along the X axis direction of the indexer unit 93 in FIG. 2). At the same time, the shuttle 95 moves the lower hands 951 toward the indexer unit 93 (to the left-hand side in FIG. 2 (−Y side)).

Having moved to in the front of the shuttle 95, the indexer robot 931 transfers the substrate W held by the lower hands 933 to the lower hands 951 of the shuttle 95. After this, the shuttle 95 moves the lower hands 951 toward the center robot 96 (to the right-hand side in FIG. 2 (+Y side)). Meanwhile, the center robot 96 moves to a position at which the hands 961 are directed to the shuttle 95.

Following this, the center robot 96, using the lower hands 961, takes out the substrate W which is held by the lower hands 951 of the shuttle 95, and moves so that the hands 961 are directed toward the shutter 911 of any one of the eight cleaning units 91. The shutter 911 is then opened, the center robot 96 stretches the lower hands 961 and loads the substrate W into inside the cleaning unit 91, whereby cleaning processing of the substrate W inside the cleaning unit 9 is started.

The substrate W for which the processing was completed inside the cleaning unit 91 is unloaded by the upper hands 961 of the center robot 96, and is transferred to the upper hands 961 of the center robot 96, the upper hands 951 of the shuttle 95 and the upper hands 933 of the indexer robot 931 in this order opposite to that for transportation of the unprocessed substrates W and eventually set at the predetermined position of the FOUP 949.

<1-2. Cleaning Units>

The structure of the cleaning units 91 will now be described with reference to FIG. 4. FIG. 4 is a schematic view which shows the structure of the cleaning units 91. The eight cleaning units 91 according to this embodiment have the same structure, and therefore, the cleaning unit 91 indicated at the arrow B3 in FIG. 2 (the cleaning unit 91 which is on the lower left corner in FIG. 1) will now be described as a representative unit, and in the description below, the cleaning units 91 according to the first embodiment will be referred to as "the cleaning unit 91a."

The cleaning unit 91a comprises a substrate holding unit 20 which holds the substrate W horizontally (within the XY plane) in such a manner that the front surface Wf of the substrate W on which patterns are formed is directed toward above (the Z direction), a cup 101 which houses the substrate holding unit 20 within itself, receives scatters and the like from the substrate holding unit 20 and the substrate W, exhausts and drains that, a shut-off mechanism 30 which is disposed opposed to the substrate front surface Wf held by the substrate holding unit 20 and shuts off the space over the substrate front surface Wf from the outside air, an ultrasonic wave-applied liquid supplier 40, and a hydrophobization agent remover 50.

The cleaning unit 91a further comprises the controller 70 which controls the operations of the respective sections of the substrate cleaning apparatus 9 based upon a program 73 which will be described later.

Owing to the respective structure elements below, the cleaning unit 91a supplies a first liquid, a second liquid, an ultrasonic liquid obtained by applying ultrasonic waves to the second liquid, hydrophobization gas, a solution and dry gas to the substrate front surface Wf or the substrate back surface Wb of the substrate W.

The substrates W are silicon wafers in the first embodiment. A pattern formed on the substrate front surface Wf includes at least an insulation film and may include a conductive film. Describing in more detail, the pattern is formed by a multi-layer film which is a stack of a plurality of films and may include an insulation film and a conductive film. The insulation film may be an $SiO_2$ film. The conductive film may be an amorphous silicon film which contains an impurity for lowering the resistance, or a metal film (such as a metal interconnection film). As the respective films which form the multi-layer film, a polysilicon film, an SiN film, a BSG film (SiO2 film containing boron), a TEOS film (SiO2 film obtained by CVD using TEOS (tetraethoxysilane)) and the like may be used for instance.

In the first embodiment, the hydrophobization gas is vapor of a hydrophobization liquid which is obtained by mixing a hydrophobization agent which hydrophobizes the patterns on the substrate front surface Wf and a solvent which dissolves the hydrophobization agent.

The hydrophobization agent may be a known hydrophobization agent in accordance with the material of the patterns of the substrate front surface Wf. For example, a hydrophobization agent may be used which contains hydrofluoric acid, a silane coupling agent, dimethylsilyl dimethylamine, dimethylsilyl diethylamine, hexamethyldisilazane, tetramethyldisilazane, bis(dimethylamino)dimethylsilane, N,N-dimethylaminotrimethylsilane, N-(trimethylsilyl)dimethylamine, an organosilane compound, amine having hydrophobic group, an organic silicon compound. In the first embodiment, a silane coupling agent is used as the hydrophobization agent.

The solvent for dissolving the hydrophobization agent, a known solvent may be used in accordance with the type of the hydrophobization agent. It is generally an organic solvent, and various types of alcohols may be used such as methanol, ethanol and isopropyl alcohol (IPA). Particularly for the purpose of supplying the hydrophobization agent to the inside of the patterns of the substrate front surface Wf, a liquid whose surface tension is lower than that of pure water for example is preferable. In the first embodiment, IPA is used as the solvent.

Used as the first liquid is a liquid which is relatively inactive to the patterns of the substrate front surface Wf, and has weaker solvency of dissolving the hydrophobization agent than the solvent which dissolves the hydrophobization agent. What is generally used as a rinse liquid is preferable, and pure water such as deionized water (DIW), carbonated water and hydrogen water is used. In the first embodiment, DIW is used as the first liquid.

A known cleaning liquid or rinse liquid is used as the second liquid in accordance with the type of the substrates W. Use of a liquid having the same composition as that of the first liquid in particular is preferable as this reduces the number of types of liquids to use and accordingly suppresses the costs of tanks and the like, and as this simplifies the structures of a liquid collection mechanism and the like. That is, it is preferable that pure water is used as the second liquid when pure water is used as the first liquid. In the first embodiment, DIW is used as the second liquid.

This is not limiting when exercising the invention: what can be used as the second liquid includes a mixture of ammonium hydroxide, a hydrogen peroxide solution and water (SC-1), a mixture of hydrochloric acid, a hydrogen peroxide solution and water (SC-2), and a mixture of dilute hydrofluoric acid (DHF) or sulfuric acid, a hydrogen peroxide solution and water (SPM).

While the liquid above is used as the second liquid in terms of composition, it is preferable that the dissolved gas concentration is at the saturation level. As dissolved gas, nitrogen gas or air (approximately 80% nitrogen and approximately 20% oxygen) is used for instance. In the first embodiment, what is used as the second liquid is DIW in which the dissolved gas concentration of nitrogen gas is 18 ppm or higher, that is, in which the dissolved gas concentration of nitrogen gas under the atmospheric pressure is at saturation.

A liquid whose solvency to the hydrophobization agent is relatively high is used as the solution, and use of a liquid whose composition is the same as that of the solvent above is particularly preferable as this reduces the costs of a tank and the like and simplifies the structures of a liquid collection mechanism and the like. In the first embodiment, IPA is used as the solution.

The dry gas is such gas in which the dew point of water vapor contained in it is lower than the temperature of the atmosphere around the substrates W (that is, the partial pressure of water vapor contained in the gas is lower than the vapor pressure of water within the atmosphere around the substrates W). To note particularly, gas whose dew point is −10 degrees (Celsius) or lower is preferable, and gas whose dew point is −40 degrees (Celsius) or lower is more preferable. The dry gas may be nitrogen gas, argon gas, helium gas or clean dry air (gas which is approximately 80% nitrogen gas and approximately 20% oxygen gas in term of partial pressure ratio). In this embodiment, nitrogen gas whose dew point is −40 degrees is used as the dry air.

The respective sections of the cleaning unit 91a will now be described.

The substrate holding unit 20 is a unit which holds the substrate W horizontally (within the XY plane) in a condition that the substrate front surface Wf or the substrate back surface Wb is directed toward above (Z direction). While the first embodiment will be described with respect to an example of holding with the substrate front surface Wf directed toward above, holding with the substrate back surface Wb directed toward above is similarly possible.

The substrate holding unit 20 comprises a disk-shaped stage 23 which is fixed to the bottom of the cleaning unit 91a and opposed to the substrate back surface Wb which is above the stage. The stage 23 is connected to a stage rotation mechanism 22 and can rotate within the horizontal plane about the central axis A0 which is along the vertical direction. In addition, at a position which intersects the central axis A0, the stage 23 has an opening as a lower nozzle 27.

In the vicinity of the periphery of the stage 23, there are a plurality of checks 24 which are upright and hold the substrate W at the periphery. There may be three or more chucks 24 for the purpose of securely holding the circular substrate W and the chucks are located at equal angular intervals along the periphery of the stage 23. Each chuck 24 comprises a support pin which supports the substrate W at the periphery from below and a hold pin which presses the exterior peripheral edge of the substrate W which is supported by the support pin and accordingly holds the substrate W, thereby functioning as a holder which holds the substrate W.

Each chuck 24 is coupled with an air cylinder not shown via a known link mechanism, a slider or the like while the controller 70 is electrically connected with a driver of the air cylinder so that the air cylinder expands and shrinks according to an operation command from the controller 70. This makes it possible for each chuck 24 to switch between "the close condition" in which the hold pin presses the exterior peripheral edge of the substrate W and "the open condition" in which the hold pin is away from the exterior peripheral edge of the substrate W. A drive source for switching each chuck 24 between the open and the close conditions may be, besides an air cylinder, a known drive source such as a motor and a solenoid.

Each chuck 24 is in the open condition for transfer of the substrate W to the stage 23 but in the close condition for cleaning processing and the like of the substrate W. When in the close condition, each chuck 24 grasps and holds the substrate W at the periphery. This keeps the substrate W away from the stage 23 by a predetermined distance and holds the substrate horizontally with the substrate front surface Wf directed toward above and the substrate back surface Wb directed toward below. The predetermined distance is dependent upon the structure and the size of the chucks 24, but is sufficiently shorter than the radius of the substrate W and may for example be from 5 mm to 30 mm.

The lower nozzle 27 provided in the stage 23 communicates with a lower inner tube 25 which penetrates toward below from the stage 23. One end of the lower inner tube 25 is connected to the lower nozzle 27, and the other end of the lower inner tube 25 is connected to a second liquid supply source 604. The second liquid supply source 604 is a supply source for supplying the second liquid into inside the lower inner tube 25.

Further, a lower outer tube 21 is disposed to the stage 23 as if to surround the lower inner tube 25. The lower outer tube 21 penetrates toward below from the stage 23 as the lower inner tube 25 does, and the lower inner tube 25 and the lower outer tube 21 form what is known as a double tube structure. A gas supply path 26 is formed between the lower outer tube 21 and the lower inner tube 25, and the gas supply path 26 is open toward the stage 23 and connected at its other end with a dry gas supply source 607. The dry gas supply source 607 is a supply source for supplying dry gas to the gas supply path 26.

The cup 101 will now be described. The cup 101 is disposed to form an approximately ring-like shape so as to surround the substrate W which is held by the substrate holding unit 20. The shape of the cup 101 is approximately rotation-symmetrical with respect to the central axis A0 in order to collect a liquid and the like splashing from the substrate holding unit 20 and the substrate W. FIG. 4 shows the cross-sectional shape of the cup 101.

The particular structure and operation of the cup 101 are similar to what is disclosed in JP-A-2006-286831 and will not be described in detail. The cup 101 is formed by an internal structure member, a middle structure member and an exterior structure member which are capable of ascending and descending independently of each other, and the structure of the cup is these members as they are stacked one atop the other. An up-and-down direction driver not shown is connected with each one of these members, and moves the respective members according to the content of substrate processing independently of each other or moves the plurality of members in synchronization in the up-and-down direction along the central axis A0.

FIG. 4 shows a condition that the respective members of the cup 101 are located at the lowest position which is a home position. The home position is a position when the center robot 96 loads the substrates W into inside the cleaning units 91 or in other instances.

The shut-off mechanism 30 will now be described. The shut-off mechanism 30 comprises a shut-off member 38 whose bottom surface is a substrate-facing surface 381 which is opposed to the substrate front surface Wf of the substrate W which is held by the substrate holding unit 20. The shut-off member 38 is disk-shaped and has an upper inner tubular nozzle 37 and an upper outer tubular nozzle 39 at the center. The substrate-facing surface 381 spreads within the horizontal plane and is opposed and parallel to the substrate front surface Wf of the substrate W which is held by the substrate holding unit 20. The diameter of the substrate-facing surface 381 of the shut-off member 38 is formed to be equal to or larger than the diameter of the substrate W. The shut-off member 38 is supported horizontally for free rotation below a rotation axis 31 which is hollow inside and approximately shaped like a cylinder.

The rotation axis 31 is connected at its upper end with an arm 32. The rotation axis 31 and the shut-off member 38 are supported by the arm 32 at upper positions which are opposed to the substrate holding unit 20. The shut-off member 38 is connected with a shut-off member rotation mechanism 33 which rotates the shut-off member 38 via the rotation axis 31 and the arm 32. The shut-off member rotation mechanism 33 is formed by a hollow motor and a hollow axis not shown, one end of the hollow axis is coupled to the rotation axis of the hollow motor, and the other end of the hollow axis is coupled to the top surface of the shut-off member 38 through the interior of the rotation axis 31.

The shut-off member rotation mechanism 33 is electrically connected with the controller 70. As the shut-off member rotation mechanism 33 is driven in accordance with an operation command from the controller 70, the shut-off member rotation mechanism 33 rotates the shut-off member 38 about the central axis which is through the center of the rotation axis 31. The shut-off member rotation mechanism 33 is capable of rotating the shut-off member 38 in the same rotation direction and approximately at the same rotation speed as those of the substrate W in accordance with rotations of the substrate W which is held by the substrate holding unit 20. The shut-off member 38 is disposed so that the central axis of the shut-off member approximately matches with the central axis A0 of the stage 23. Hence, the stage 23 and the shut-off member 38 rotate horizontally about approximately the same central axes.

A shut-off member ascend/descend mechanism 34 formed by a known drive mechanism is connected to the arm 32.

The shut-off member ascend/descend mechanism 34 is electrically connected with the controller 70. As the shut-off member ascend/descend mechanism 34 is driven in accordance with an operation command from the controller 70, the shut-off member ascend/descend mechanism 34 moves the shut-off member 38 closer to or away from the stage 23.

That is, the controller 70 makes the shut-off member 38 ascend to a distant position above the substrate holding unit 20 for loading or unloading of the substrate W into or from the cleaning unit 91a or for execution of a hydrophobization agent removing step described later upon the substrate W by controlling the operation of the shut-off member ascend/descend mechanism 34. Meanwhile, for execution of a hydrophobization agent supplying step, a solvent removing step, a cleaning step and the like described later upon the substrate W, the shut-off member 38 is caused to descend to an opposed position which is very close to the substrate front surface Wf held by the substrate holding unit 20.

The duct structure of the shut-off mechanism 30 will now be described. An upper outer tube 35 is inserted into and penetrate the interior of the hollow section which is through all the way from the top surface of the arm 32 of the shut-off mechanism 30 to the rotation axis 31 and further to the opening at the center of the shut-off mechanism 38, and an upper inner tube 36 is inserted into and penetrate the upper outer tube 35, whereby the so-called double tube structure is formed. The lower ends of the upper outer tube 35 and the upper inner tube 36 extend to the opening of the shut-off member 38, one end of the upper inner tube 36 is connected with the upper inner tubular nozzle 37, and one end of the upper outer tube 35 is connected with the upper outer tubular nozzle 39. The upper inner tubular nozzle 37 and the upper outer tubular nozzle 39 are provided in a central area of the substrate-facing surface 381 of the shut-off member 38.

The other end of the upper inner rube 36 is connected with a first liquid supply source 603. The first liquid supply source 603 is a supply source for supplying the first liquid to the upper inner tube 36. The other end of the upper outer rube 35 is connected with a hydrophobization gas supply source 601 and a dry gas supply source 602. The hydrophobization gas supply source 601 is a supply source for providing the upper outer tube 35 with hydrophobization gas which is vapor of a hydrophobization liquid, which is obtained by mixing a hydrophobization agent which hydrophobizes the patterns of the substrate front surface Wf, into a solvent. The dry gas supply source 602 is a supply source which supplies dry gas to the upper outer tube 35. The hydrophobization gas supply source 601 and the dry gas supply source 602 are each capable of supplying hydrophobization gas or dry gas to the upper outer tube 35 independently of each other.

The structure of the ultrasonic wave-applied liquid supplier 40 will now be described. The ultrasonic wave-applied liquid supplier 40 supplies the ultrasonic wave-applied liquid, which is obtained by applying ultrasonic waves upon the second liquid, to the substrate W. The ultrasonic wave-applied liquid supplier 40 comprises an ultrasonic nozzle 41, an ultrasonic wave outputting mechanism 43 which outputs an ultrasonic signal to a vibrator 42 of the ultrasonic nozzle 41, and a second liquid supply source 605 which communicates with and is connected with the ultrasonic nozzle 41.

The ultrasonic nozzle 41 is fixed by a nozzle attaching member to the top section of the outer most part of the cup 101 in such a manner that the discharge outlet of the ultrasonic nozzle 41 is directed toward the central axis A0. When the cup 101 is at the home position as shown in FIG. 4, the ultrasonic nozzle 41 is set to a lower position than the substrate back surface Wb of the substrate W held by the substrate holding unit 20, and at this time, the discharge outlet of the ultrasonic nozzle 41 is directed toward from the exterior peripheral area of the stage 23 to the periphery of the substrate back surface Wb. The direction to which the discharge outlet is directed with the nozzle positioned like this will now be referred to as "the discharge direction 44." As the second liquid is pressure-fed to the ultrasonic nozzle 41 from the second liquid supply source 605 with the nozzle positioned as described above, the second liquid is supplied to the substrate back surface Wb from the discharge outlet of the ultrasonic nozzle 41 along the discharge direction 44.

The vibrator 42 is disposed inside the ultrasonic nozzle 41. The vibrator 42 applies ultrasonic vibrations upon the second liquid which is supplied into inside the ultrasonic nozzle 41. Describing in detail, the vibrator 42 is disposed on the opposite side to the discharge outlet of the ultrasonic nozzle 41 along the discharge direction 44 as shown in FIG. 4.

The ultrasonic wave outputting mechanism 43 is a mechanism which is electrically connected with the controller 70 and outputs a pulse signal to the vibrator 42 based upon a control signal from the controller 70. As the pulse signal is inputted to the vibrator 42, the vibrator 42 ultrasonically vibrates.

As the ultrasonic wave outputting mechanism 43 makes the vibrator 42 ultrasonically vibrate in a condition that the second liquid is supplied to the substrate back surface Wb along the discharge direction 44 from the discharge outlet of the ultrasonic nozzle 41, ultrasonic waves are applied upon the second liquid and the ultrasonic wave-applied liquid which is obtained by applying ultrasonic waves upon the second liquid is supplied to the substrate back surface Wb. This propagates ultrasonic vibrations to the substrate back surface Wb and realizes ultrasonic cleaning of the substrate back surface Wb.

Next, a hydrophobization agent remover 50 will be described. The hydrophobization agent remover 50 comprises a nozzle 51, an arm 52 whose one end is connected with the nozzle 51, a rotation axis 53 which is connected with the other end of the arm 52, an arm rotation mechanism 54 which rotates the rotation axis 53 about the central axis A1 which is along the vertical direction in order to rotate the arm 52 and the nozzle 51 about a central axis A1, and a solution supply source 606 which is a supply source for supplying the solution to the nozzle 51. The operation of the nozzle 51 of rotating about the central axis A1 will be described later.

Figure 5:
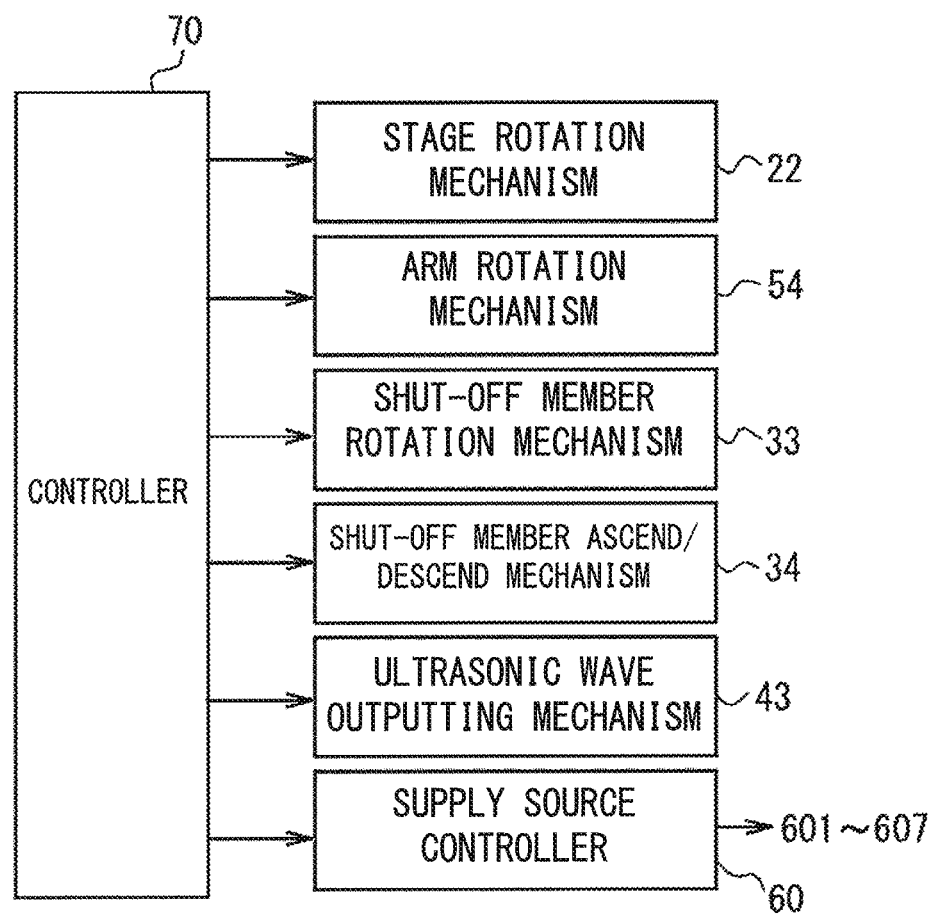
FIG. 5 is a block diagram showing electric structure of the cleaning unit of FIG. 4.

The inner structure of the controller 70 will now be described. FIG. 5 is a block diagram which schematically shows electric connection between the controller 70 and the respective structure elements of the cleaning unit 91a.

The controller 70 is electrically connected with the respective structure elements of the cleaning unit 91a as shown in FIG. 5 and controls the respective structure elements in accordance with operation commands. In addition to the above, the controller 70 is electrically connected with a supply source controller 60. The supply source controller 60 is a controller which is electrically connected with each one of the supply sources 601 through 607 and controls supplying of the liquids or gas from the supply sources independently of each other. In accordance with an operation command from the supply source controller 60, for example, the second liquid is pressure-fed from the second liquid supply source 604 to the lower nozzle 27 or the pressure feeding of the second liquid is suspended. In a similar fashion, in accordance with an operation command from the supply source controller 60, for example, the solution is pressure-fed from the solution supply source 606 to the nozzle 51 or the pressure feeding of the solution is suspended. The controller 70 comprehensively controls outputting of command from the supply source controller 60.

Figure 6:
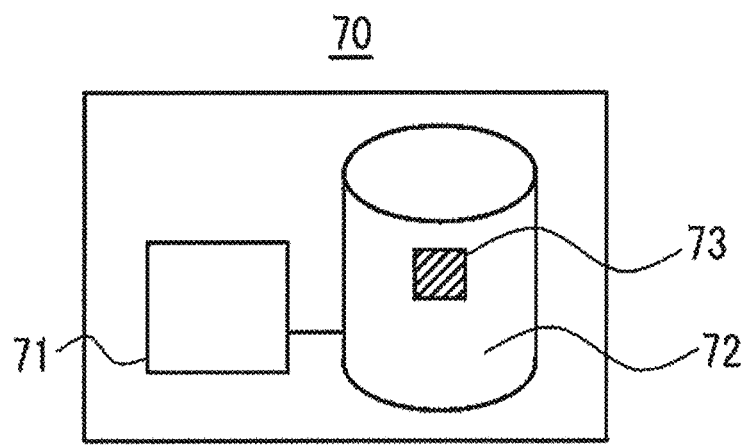
FIG. 6 is a schematic diagram showing the structure of the controller of the cleaning unit of FIG. 4.

FIG. 6 is a schematic diagram which shows the inner structure of the controller 70. The controller 70 is formed by a computer which has a computation processor 71 and a memory 72. A CPU which performs various types of computation may be used as the compute processor 71. The memory 72 comprises a ROM which is a memory dedicated to reading and which stores a basic program, a RAM which is a memory for freely writing and reading various types of information and a magnetic disk which is for storing control software, data, etc. The magnetic disk stores in advance substrate processing conditions in accordance with the substrates W as programs 73 (which are referred to also as recipes), the CPU retrieves this content to the RAM, and in accordance with the content of the substrate processing program retrieved to the RAM, the CPU controls the respective sections of the substrate cleaning apparatus 9. Connected to the controller 70 is the operation part 971 (FIG. 1) which is used for creating and modifying the programs 73 and selecting a desired one out of the plurality of programs 73.

A processing liquid supplier 110 will now be described which supplies DIW (processing liquids), as the first and the second liquids, to the first liquid supply source 603 and the second liquid supply sources 604 and 605.

FIG. 7 is a drawing which schematically shows the structure of the processing liquid supplier 110. In the first embodiment, DIW which is the same processing liquid is used as the first and the second liquids, and therefore, the same processing liquid supplier 110 is connected with the supply sources 603, 604 and 605.

The processing liquid supplier 110 comprises a reservoir 111 which stores a processing liquid L2 (DIW in the first embodiment), pipes 113 and 114 whose one ends are connected with the reservoir 111, a nitrogen gas supply source 620 which is a supply source which is connected with the other end of the pipe 113 and supplies nitrogen gas to the pipe 113, and a pump 112 which is interposed in the pipe 113 and pressure-feeds nitrogen gas from the nitrogen gas supply source 620 toward the reservoir 111.

The processing liquid supplier 110 further comprises pipes 115, 116 and 117 which are connected with the other branch ends of the branching pipe 114, a valve V1 interposed in the pipe 115, a valve V2 interposed in the pipe 116 and a valve V3 interposed in the pipe 117.

The end of the pipe 115 on the opposite side to the pipe 114 is connected with the first liquid supply source 603, the end of the pipe 116 on the opposite side to the pipe 114 is connected with the second liquid supply source 604, the end of the pipe 117 on the opposite side to the pipe 114 is connected with the second liquid supply source 605. The valves V1 through V3 can respectively control the communication of the pipes 115 through 117 by opening and closing.

The pump 112 and the valves V1 through V3 are each electrically connected with the supply source controller 60. When the valve V1 is opened in a condition that the pump 112 is driven and nitrogen gas is pressure-fed to the reservoir 111 from the nitrogen gas supply source 620 in accordance with an operation command from the supply source controller 60, the processing liquid L2 is supplied to the first liquid supply source 603 via the pipes 114 and 115, and the processing liquid L2 as the first liquid is discharged from the upper inner tubular nozzle 37 via the upper inner tube 36 from there.

In a similar manner, when the valve V2 is opened in a condition that the pump 112 is driven and nitrogen gas is pressure-fed to the reservoir 111 from the nitrogen gas supply source 620 in accordance with an operation command from the supply source controller 60, the processing liquid L2 is supplied to the second liquid supply source 604 via the pipes 114 and 116, and the processing liquid L2 as the second liquid is discharged from the lower nozzle 27 via the lower inner tube 25 from there.

In a similar manner, when the valve V3 is opened in a condition that the pump 112 is driven and nitrogen gas is pressure-fed to the reservoir 111 from the nitrogen gas supply source 620 in accordance with an operation command from the supply source controller 60, the processing liquid L2 is supplied to the second liquid supply source 605 via the pipes 114 and 117, the processing liquid L2 as the second liquid is discharged from the discharge outlet of the ultrasonic nozzle 41 from there.

Since the processing liquid supplier 110 according to the first embodiment has the structure which pressure-feeds nitrogen gas and accordingly supplies the processing liquid L2 to the respective sections of the cleaning unit 91a, when the processing liquid L2 is left within the reservoir 111 for long hours, the dissolved gas concentration of nitrogen gas, which is the atmosphere within the reservoir, in the processing liquid L2 becomes saturated. To be specific, the concentration is about the same as or higher than 18 ppm which is the saturated dissolved gas concentration of nitrogen gas dissolved in DIW under the atmospheric pressure. This is because in reality, the processing liquid L2 is exposed to the environment of a higher pressure than the atmospheric pressure because of pressure feeding of nitrogen gas, and therefore, it is possible to dissolve nitrogen gas of a higher concentration than the saturated dissolved gas concentration of nitrogen gas in DIW under the atmospheric pressure.

A hydrophobization gas supplier 120 will now be described which supplies hydrophobization gas to the hydrophobization gas supply source 601.

Figure 8:
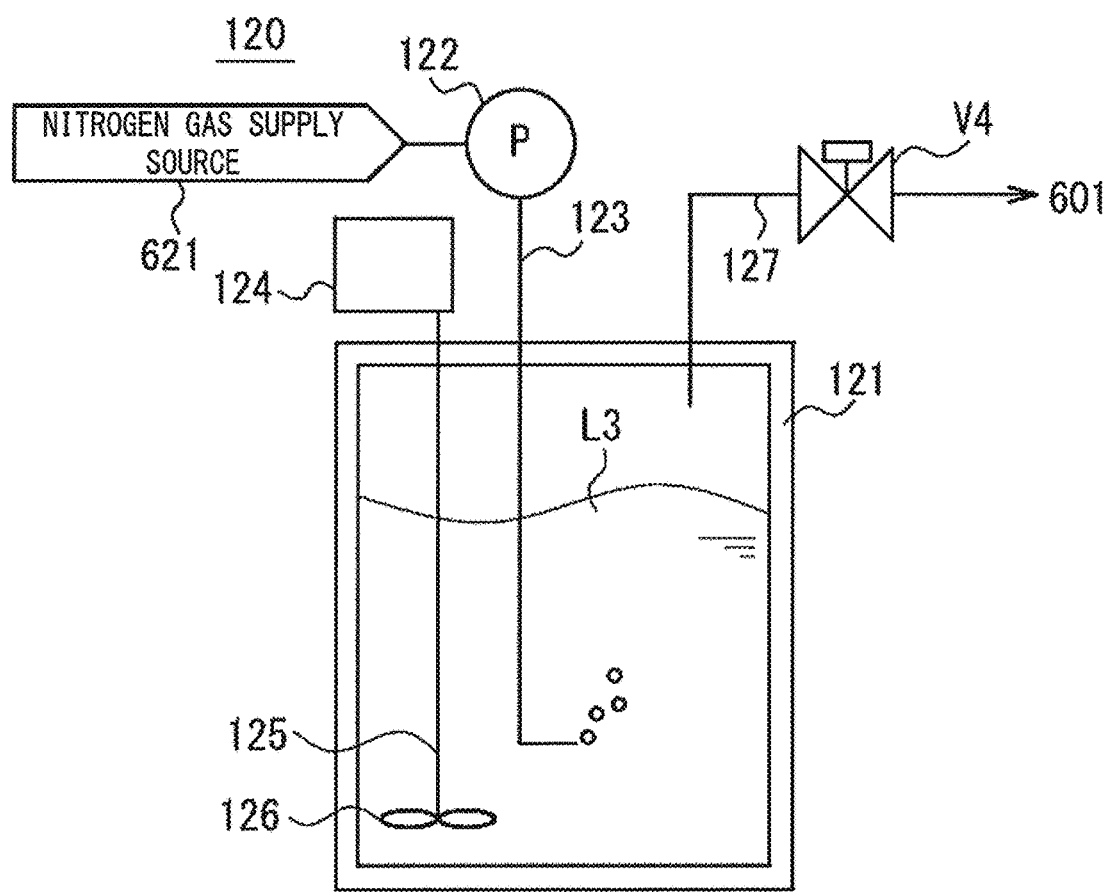
FIG. 8 is a drawing showing the structure of the hydrophobization gas supplier according to first embodiment.

FIG. 8 is a drawing which schematically shows the structure of the hydrophobization gas supplier 120. The hydrophobization gas supplier 120 vaporizes a hydrophobization liquid L3, which is a mixture of the hydrophobization agent and the solvent, by the so-called bubbling method. When the invention is exercised, the vaporization method for obtaining the hydrophobization gas is not however limited to the bubbling method but may be various vaporization methods such as heating.

The hydrophobization gas supplier 120 comprises a reservoir 121 which stores the hydrophobization liquid L3 (which is the mixed solution of a silane coupling agent and IPA according to the first embodiment), pipes 123 and 127 whose one ends are connected with the reservoir 121, a valve V4 interposed in the pipe 127, a nitrogen gas supply source 621 which is a supply source which is connected with the other end of the pipe 123 and supplies nitrogen gas to the pipe 123, a pump 122 which is interposed in the pipe 123 and pressure-feeds nitrogen gas from the nitrogen gas supply source 621 toward the reservoir 121, a propeller 126, a propeller rotation mechanism 124 which rotates the propeller 126, and a rotation axis 125 which connects the propeller 126 with the propeller rotation mechanism 124.

The end of the pipe 127 on the opposite side to the reservoir 121 is connected with the hydrophobization gas supply source 601, and the valve V4 can control communication of the pipe 127 by opening and closing. The hydrophobization liquid L3 is stored into the reservoir 121 so as not to exceed a predetermined quantity which is smaller than the capacity of the reservoir 121. That is, it is stored so as not to exceed a predetermined liquid surface line within the reservoir 121. The end of the pipe 127 connected with the reservoir 121 opens above the liquid surface line of the reservoir 121. That is, this opening does not soak in the hydrophobization liquid L3 even when the hydrophobization liquid L3 is supplied to the reservoir 121.

Meanwhile, the end of the pipe 123 connected with the reservoir 121 opens below the liquid surface line of the reservoir 121. That is, this opening soak in the hydrophobization liquid L3 when the hydrophobization liquid L3 is supplied and stored up to the liquid surface line of the reservoir 121.

In a similar manner, the propeller 126 as well is disposed below the liquid surface line of the reservoir 121. To particularly note, it is preferable that the propeller 126 is located lower in the reservoir 121 from the perspective of favorably stirring the hydrophobization liquid L3.

The pump 122, the valve V4 and the propeller rotation mechanism 124 are each electrically connected with the supply source controller 60. When the pump 122 is driven and nitrogen gas is pressure-fed to the reservoir 121 from the nitrogen gas supply source 620 in accordance with an operation command from the supply source controller 60 in a condition that hydrophobization liquid L3 is stored up to the liquid surface line, bubbles of nitrogen gas are created at the opening of the pipe 123 which soaks in the hydrophobization liquid L3. Before the bubbles reach the liquid surface of the hydrophobization liquid L3, vapor of the hydrophobization liquid L3, namely, hydrophobization gas G1 is supplied into inside the bubbles.

As the valve V4 is opened in this condition in accordance with an operation command from the supply source controller 60, the hydrophobization gas G1 is supplied to the hydrophobization gas supply source 601 via the pipe 127 and discharged from the upper outer tubular nozzle 39 through a part which is inside the upper outer tube 35 but outside the upper inner tube 36.

When the propeller rotation mechanism 124 is driven in accordance with an operation command from the supply source controller 60, the propeller rotation mechanism 124 rotates the propeller 126 about the rotation axis 125 via the rotation axis 125. This makes it possible to stir the hydrophobization liquid L3 stored inside the reservoir 121. Stir using the propeller 126 is not essential to implementation of the invention, and other various types of stir methods may be used.

The operation of the nozzle 51 in the hydrophobization agent remover 50 will now be described with reference to FIG. 9.

Figure 9:
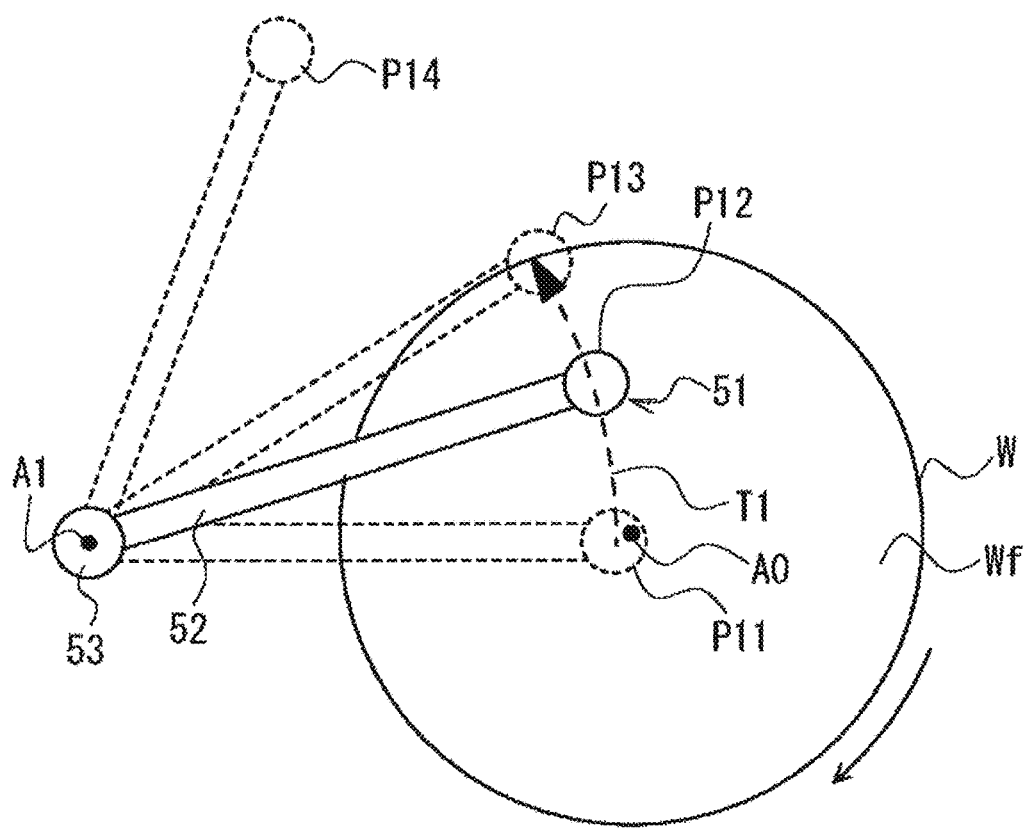
FIG. 9 is a drawing showing the operation of hydrophobization agent remover according to first embodiment.

FIG. 9 is a drawing which schematically shows the rotation action of the nozzle 51 about the central axis A1 and the positional relation of the nozzle 51 and the substrate W which is held by the substrate holding unit 20.

When the arm rotation mechanism 54 rotates the rotation axis 53 about the central axis A1 based upon an operation command from the controller 70, the arm 52 swings and the nozzle 51 moves along a trajectory T1, opposing to the substrate front surface Wf of the substrate W which is held by the substrate holding unit 20. The trajectory T1 is a trajectory from a center position P11 to a peripheral position P13 via a position P12.

The center position P11 is above the substrate W and approximately above the central axis A0, while the peripheral position P13 is above the exterior peripheral edge of the periphery of the substrate W. That is, the arm rotation mechanism 54 moves the nozzle 51 relative to the substrate W along the parallel direction to the substrate front surface Wf. Further, the nozzle 51 can move to a retract position P14 which is on the extension line of the trajectory T1 but off to the side from the position opposed to the substrate W.

In addition, since the substrate W is rotated as the stage 23 rotates, as the aim rotation mechanism 54 swings the arm 52 in a condition that the stage 23 is made to rotate by the stage rotation mechanism 22, the nozzle 51 can be opposed to the entire surface of the substrate W sequentially, that is, the nozzle 51 can scan the entire surface of the substrate W.

<1-3. Steps of Substrate Processing>

The operation of substrate processing in the substrate cleaning apparatus 9 having the structure above will now be described. Concave and convex patterns are formed on the substrate front surface Wf at the previous step. The patterns include concave and convex sections. The convex sections are within the height range of 100 to 200 nm and the width range from 10 to 20 nm for instance. The distances between the adjacent convex sections (the widths of the concave sections) are within the range of 10 to 20 nm for example.

The steps of substrate processing will now be described based upon FIG. 10 while referring to FIG. 4 as needed. FIG. 10 is a flow chart which shows the overall operation performed by the substrate cleaning apparatus 9 according to the first embodiment. The assumption for the description below is that the shut-off mechanism 30 rotates the shut-off member 38 at approximately the same number of rotations along the direction in which the stage rotation mechanism 22 of the substrate holding unit 20 rotates the stage 23 when the shut-off member 38 is at the opposed position unless otherwise specified.

First, the substrate processing program 73 in accordance with the predetermined substrate W is selected with the operation part 971 (FIG. 1) and executed. Following this, as preparation for loading of the substrate W into the cleaning unit 91a, the controller 70 provides an operation command and the following is carried out.

That is, in accordance with the operation command from the controller 70, the shut-off member 38 stops rotating and the stage 23 stops rotating. Further, the shut-off member 38 moves to the distant position and the stage 23 is set to a proper position for transfer of the substrate W. In addition, the cup 210 is set to the home position. After setting the stage 23 to the proper position for transfer of the substrate W, each chuck 24 is set to the opens condition. Further, the nozzle 51 is set to the retract position P14.

After completion of the preparation to load the substrate W into the cleaning unit 91a, a substrate loading step of loading the unprocessed substrate W into the cleaning unit 91a is performed (Step S101). That is, the indexer robot 931, using the lower hands 933, takes out the substrate W which is at the predetermined position of the FOUP 949 on the opener 94 and transfers the substrate W onto the lower hands 951 of the shuttle 95. After this, the lower hands 951 of the shuttle 95 move toward the center robot 96, and the center robot 96, using the lower hands 961, pick up the substrate W on the lower hands 951 of the shuttle 95.

Following this, the shutter 911 of the cleaning unit 91a is opened, and the center robot 96 stretches its lower hands 961 into inside the cleaning unit 91a and sets the substrate W on the support pins of the chucks 24 of the substrate holding unit 20. Upon completion of loading of the substrate W into the cleaning unit 91a, the center robot 96 shrinks its lower hands 961 and brings them out from the cleaning unit 91a. The shutter 911 is then closed.

Substrate holding/rotating step of holding the substrate W loaded into inside the cleaning unit 91a and rotating it is executed (Step S102). That is, after getting loaded into inside the cleaning unit 91a, the unprocessed substrate W is set on the support pins of the chucks 24. The controller 70 then provides an operation command to the substrate holding unit 20, and the chucks 24 are closed (the substrate holding step).

After the unprocessed substrate W is held by the substrate holding unit 20, the controller 70 then provides an operation command to the substrate holding unit 20 so that the stage 23 starts rotating (the substrate rotating step). The rotations are maintained from a hydrophobization agent supplying step after this until a substrate drying step.

At this stage, the initial rotation speed of the substrate W is preferably from 100 to 1000 rpm so that hydrophobization gas supplied to the substrate front surface Wf can spread all over the substrate front surface Wf. This embodiment will be described on the assumption that the rotation speed of the substrate W is 200 rpm at the hydrophobization agent supplying step.

Figure 11:
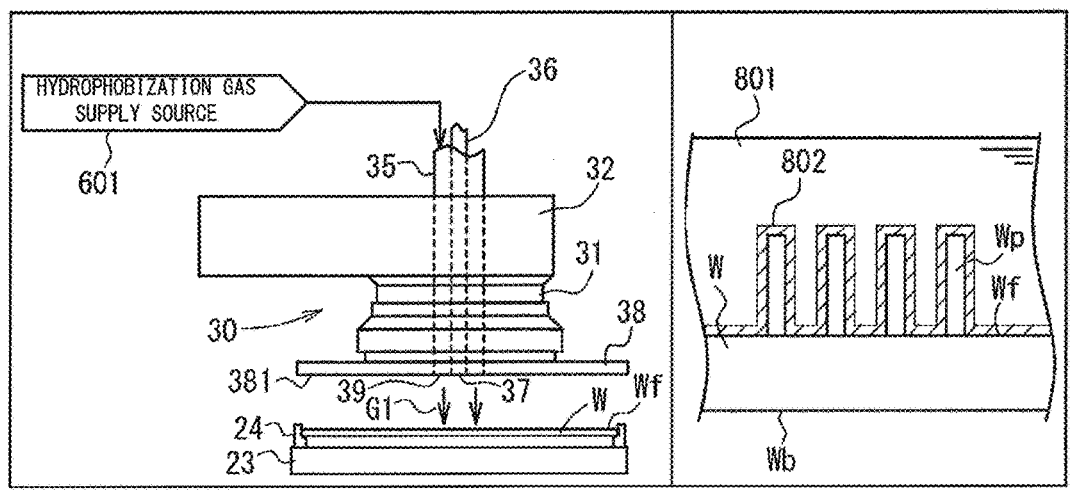
FIG. 11 is a drawing showing the hydrophobization agent supplying step.

Next, the hydrophobization agent supplying step (Step S103) is executed as a part of a hydrophobization step of hydrophobizing the patterns of the substrate front surface Wf. FIG. 11 is a drawing which schematically shows the hydrophobization agent supplying step. In FIG. 11, the left-hand side section shows the respective structure elements as they are within the cleaning unit 91a, and the right-hand side section expands a pattern area within the substrate front surface Wf (The convex sections of the patterns will hereinafter be referred to as "the patterns Wp.").

After the hydrophobization agent supplying step starts, the controller 70 provides an operation command to the shut-off member ascend/descend mechanism 34, whereby the shut-off member 38 is arranged such that the substrate-facing surface 381 comes to a proximal position close to the substrate front surface Wf. Before or after these actions, the controller 70 provides an operation command to the shut-off member rotation mechanism 33, and the shut-off member 38 rotates.

In this condition, the hydrophobization gas G1 from the hydrophobization gas supply source 601 is supplied from the upper outer tubular nozzle 39 to the substrate front surface Wf in accordance with an operation command from the controller 70. The hydrophobization gas G1 is supplied from a central area of the substrate front surface Wf to the periphery of the substrate W as rotation of the substrate W with rotation of the stage 23 and rotation of the shut-off member 38, and hydrophobizes the patterns Wp which are formed on the substrate front surface Wf.

As shown in the right-hand section in FIG. 11, thus supplied hydrophobization gas G1 condenses at the substrate front surface Wf, becomes a hydrophobization liquid 801, and fills up even between the neighboring patterns Wp, whereby a hydrophobization film 802 having low wettability coats the substrate front surface Wf including the surfaces of the patterns Wp.

As the hydrophobization gas G1 is supplied with the shut-off member 38 staying close by, the hydrophobization gas G1 can reach even a micro space which is created between the substrate-facing surface 381 and the substrate front surface Wf and cover the entire substrate front surface Wf, and it is thus possible to attain hydrophobization with a small amount of the chemical solution. Further, since the patterns Wp to be hydrophobize are relatively very small, even the extremely small amount of the hydrophobization liquid 801 created on the substrate front surface Wf through supply and condensation of the hydrophobization gas G1 can adequately fill up the spaces between the patterns Wp, which is preferable to attain hydrophobization with a small amount of the chemical solution.

The hydrophobization film 802 is a film which is formed as the silane coupling agent reacts or contacts with the substrate front surface Wf, and as it coats the surfaces of the patterns Wp in a condition that the hydrophobic groups of the silane coupling agent tend to face outward beyond the patterns Wp, the surfaces of the patterns Wp are hydrophobized. For the purpose of highly activating hydrophobization using the hydrophobic groups, processing such as heating may be additionally performed.

Figure 12:
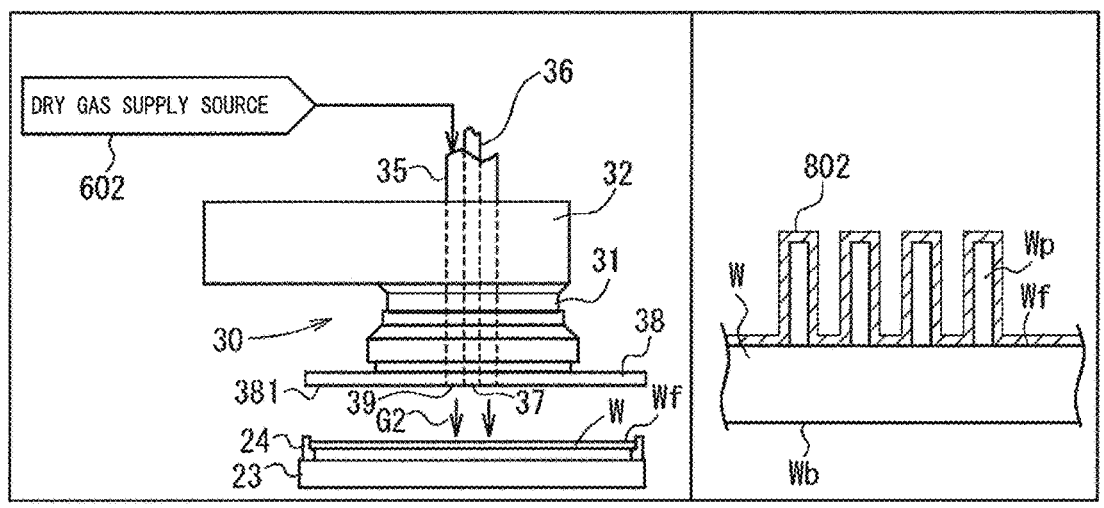
FIG. 12 is a drawing showing the solvent removing step.

A solvent removing step (Step S104) is then executed as a part of the hydrophobization step of hydrophobizing the patterns of the substrate front surface Wf. FIG. 12 is a drawing which schematically shows the solvent removing step. In FIG. 12, the left-hand side section shows the respective structure elements as they are inside the cleaning unit 91a, while the right-hand side section expands the pattern area within the substrate front surface Wf.

As the hydrophobization agent supplying step is started, the controller 70 provides an operation command to the shut-off member ascend/descend mechanism 34 and the shut-off member rotation mechanism 33, and the shut-off member 38 is kept staying at the proximal position and rotating.

Following this, the controller 70 provides an operation command to the stage rotation mechanism 22, and the rotation speed is changed. The rotation speed of the substrate W at the solvent removing step is preferably 500 to 1000 rpm so that the hydrophobization liquid 801 on the substrate front surface Wf can be shaken off by centrifugal force along the directions toward the periphery of the substrate front surface Wf. This embodiment will be described on the assumption that the rotation speed of the substrate W is 700 rpm at the solvent removing step.

In this condition, the dry gas G2 from the dry gas supply source 602 is supplied from the upper outer tubular nozzle 39 to the substrate front surface Wf in accordance with an operation command from the controller 70. The dry gas G2 is supplied from a central area of the substrate front surface Wf to the periphery of the substrate W as rotation of the substrate W with rotation of the stage 23 and rotation of the shut-off member 38, and dries and accordingly removes the solvent which is contained in the hydrophobization liquid 801 which has been supplied to the substrate front surface Wf.

At the solvent removing step, the hydrophobization liquid 801 is shaken off and removed by centrifugal force along the directions toward the periphery of the substrate front surface Wf as the substrate W rotates, and the drying air G2 which is supplied dries and accordingly removes the solvent which is contained in the hydrophobization liquid 801, thereby leaving the hydrophobization agent (the silane coupling agent) which has contacted the front surface as the hydrophobization film 802 on the substrate front surface Wf including the surfaces of the patterns Wp.

This removes extra hydrophobization liquid 801 and solvent but leaves the hydrophobization film 802, and gas (the dry gas and the atmosphere inside the cleaning unit) is present between the neighboring patterns Wp.

Figure 13:
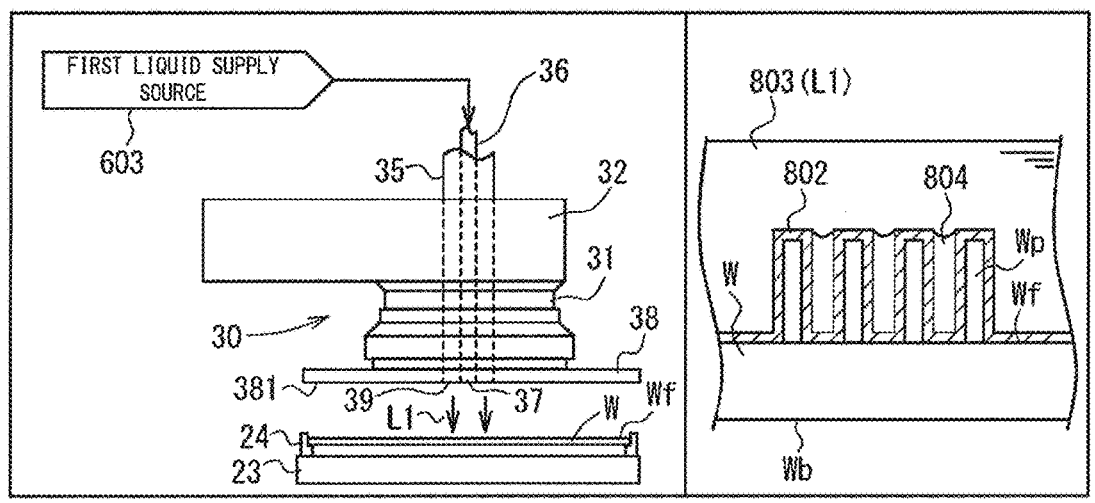
FIG. 13 is a drawing showing the cleaning step of FIG. 10.

Next, a cleaning step of cleaning the substrate back surface Wb by use of the ultrasonic wave-applied liquid in a condition that the liquid film of the first liquid is formed on the substrate front surface Wf is executed (Step S105). FIG. 13 is a drawing which schematically shows the state in which the liquid film of the first liquid is on the substrate front surface Wf during the cleaning step. In FIG. 13, the left-hand side section shows the respective structure elements as they are within the cleaning unit 91a, and the right-hand side section expands the pattern area within the substrate front surface Wf.

As the cleaning step is started, the controller 70 provides an operation command to the shut-off member ascend/descend mechanism 34 and the shut-off member rotation mechanism 33, and the shut-off member 38 is kept staying at the proximal position and rotating.

Following this, the controller 70 provides an operation command to the stage rotation mechanism 22, and the rotation speed is changed. The rotation speed of the substrate W at the cleaning step is preferably 100 to 700 rpm so that the first liquid supplied to the substrate front surface Wf can form the liquid film on the substrate front surface Wf. This embodiment will be described on the assumption that the rotation speed of the substrate W is 500 rpm at the cleaning step.

In this condition, the first liquid L1 is supplied from the first liquid supply source 603 to the substrate front surface Wf via the upper inner tubular nozzle 37 in accordance with an operation command from the controller 70. The first liquid L1 is supplied from a central area of the substrate front surface Wf to the periphery of the substrate W as rotation of the substrate W with rotation of the stage 23 and rotation of the shut-off member 38, and the liquid film of the first liquid is formed on the substrate front surface Wf (substrate-front-surface liquid film forming step). In the first embodiment, the processing liquid L2 (FIG. 7) and the first liquid L1 are liquids having the same composition.

As shown in the right-hand section in FIG. 13, the liquid film of the first liquid 803 supplied to the substrate front surface Wf is sufficiently thicker than the height of the patterns Wp. The hydrophobization film 802 has already been formed on the surfaces of the patterns Wp at the hydrophobization agent supplying step and the solvent removing step has already allowed for the presence of the gas 804 between the neighboring patterns Wp. The contact angle of the first liquid 803 with respect to the patterns Wp is relatively large (almost 90 degrees) because of the hydrophobization film 802, which prevents the first liquid 803 from penetrating into the areas between the neighboring patterns Wp. As a result, the gas 804 is left between the neighboring patterns Wp.

In this condition, the second liquid L2 is supplied from the second liquid supply source 604 to a central area of the substrate back surface Wb via the lower nozzle 27 in accordance with an operation command from the controller 70, and owing to centrifugal force created by rotations of the substrate W, is spread to the periphery of the substrate W, whereby the liquid film of the second liquid is formed on the substrate back surface Wb.

The second liquid is supplied to the ultrasonic nozzle 41 from the second liquid supply source 605 in accordance with an operation command from the controller 70, and in a condition that ultrasonic waves are applied upon the second liquid introduced into inside the ultrasonic nozzle 41 because of vibrations of the vibrator 42 provided by the ultrasonic wave outputting mechanism 43, the ultrasonic wave-applied liquid is supplied to the substrate back surface Wb along the discharge direction 44 from the outlet of the ultrasonic nozzle 41. This makes ultrasonic vibrations propagate even to the second liquid supplied to the substrate back surface Wb from the second liquid supply source 604, and attains favorable cleaning of the substrate back surface Wb (ultrasonic cleaning step).

The second liquid is a liquid in which the dissolved gas concentration is saturated as described with reference to FIG. 7, and therefore, energy (cavitation energy) of generation and collapse of bubbles (cavitation) because of application of ultrasonic waves powerfully act upon contaminants such as particles adhering to the substrate back surface Wb. This removes the particles adhering to the substrate back surface Wb, and the particles mix into the second liquid which spreads from the central area of the substrate W to the periphery of the substrate W by centrifugal force owing to rotations of the substrate W, is shaken off together outward from the periphery of the substrate W and is removed.

The effect of preventing pattern destruction and contamination of the substrate front surface Wf will be described next. Ultrasonic vibrations applied upon the substrate back surface Wb propagate also to the substrate front surface Wf via the substrate W, and cavitation occurs and collapses even inside the first liquid. If there is a liquid between the patterns Wp (if the areas between the patterns Wp are filled with the first liquid for instance), cavitation energy acts also upon the patterns Wp because of the contact of the liquid with the surface of the patterns Wp, and particularly, the side surfaces of the patterns Wp, thereby damage such as breaking of the patterns Wp is potentially caused.

In contrast, according to the first embodiment, as shown in the right-hand side section in FIG. 13, the substrate back surface Wb is cleaned ultrasonically with the gas 804 present between the patterns Wp. That is, the surfaces of the patterns Wp and at least the side surfaces of the neighboring patterns Wp are not in contact with the liquid, which prevents cavitation energy from acting upon these side surfaces which are weak and attains the effect of preventing collapse of the patterns of the substrate front surface Wf.

While the substrate back surface Wb may be cleaned ultrasonically without supplying a liquid such as the first liquid to the substrate front surface Wf if what is desired is simply the presence of gas between the patterns Wp, in that instance, a liquid such as the ultrasonic wave-applied liquid supplied to the substrate back surface Wb may be splashed by structure elements such as the chucks 24, adhere to the substrate front surface Wf and contaminate the patterns on the substrate front surface Wf. Besides splashing of a liquid, contaminants such as particles floating in the atmosphere may adhere to the substrate front surface Wf which is exposed without any liquid film which coats and contaminate the patterns on the substrate front surface Wf.

In contrast, according to the first embodiment, as shown in the right-hand side section in FIG. 13, the areas above the patterns Wp and sections of the substrate front surface Wf which do not have the patterns Wp are coated with the liquid film of the first liquid 803, and the first liquid 803 is continuously supplied from the first liquid supply source 603 during cleaning of the substrate back surface Wb, thereby keeping the substrate front surface Wf always clean and attaining the effect of preventing splashing of a liquid from the substrate back surface Wb and contamination of the patterns of the substrate front surface Wf which is otherwise caused by adhesion of particles which are present in the atmosphere.

After ultrasonic cleaning of the substrate back surface Wb through the cleaning step, a hydrophobization agent removing step (S106) of removing the hydrophobization agent adhering as the hydrophobization film 802 from the substrate front surface Wf is executed.

As the hydrophobization agent removing step is carried out, the controller 70 provides an operation command to the shut-off member ascend/descend mechanism 34 and the shut-off member rotation mechanism 33, the shut-off member 38 moves to the distant position and the shut-off member 38 stops rotating.

Following this, the controller 70 provides an operation command to the stage rotation mechanism 22, and the rotation speed is changed. It is desired that the rotation speed of the substrate W at the hydrophobization agent removing step is set according to the scan speed, the scan count or the like of the nozzle 51 so that the nozzle 51 which discharges the solution can entirely scan the substrate front surface Wf.

Next, the controller 70 provides an operation command to the arm rotation mechanism 54, and the nozzle 51 is set to the center position P11 from the retract position P14 (See FIG. 9.).

In this condition, the solution is supplied to the substrate front surface Wf via the nozzle 51 from the solution supply source 606 in accordance with an operation command from the controller 70. The solution is supplied from a central area of the substrate front surface Wf to the periphery of the substrate W as the substrate W rotates in accordance with rotations of the stage 23. The hydrophobization agent, which forms the hydrophobization film 802 on the substrate front surface Wf, is therefore dissolved in the solution, shaken off together with the solution outward from the periphery as the substrate W rotates, and removed from the substrate front surface Wf. The areas between the neighboring patterns Wp are filled with the solution instead of the hydrophobization film 802.

Meanwhile, the controller 70 provides an operation command to the arm rotation mechanism 54, and the nozzle 51 moves reciprocally for a predetermined number of times which may be one time or more than one times between the center position P11 and the peripheral position P13. This makes it possible to supply the solution to the entire substrate front surface Wf and remove the hydrophobization film 802 from the substrate front surface Wf including an area between the neighboring patterns Wp without fail.

Alternatively, during the hydrophobization agent removing step, in accordance with an operation command from the controller 70, the second liquid may be supplied to the substrate back surface Wb via the lower nozzle 27 from the second liquid supply source 604 (or supplying of the second liquid from the second liquid supply source 604 may be maintained even from the middle of the cleaning step which is immediately before the hydrophobization agent removing step). This prevents contamination of the substrate back surface Wb during the hydrophobization agent removing step.

After removal of the hydrophobization film 802 from the substrate front surface Wf through the hydrophobization agent removing step, a substrate drying step (S107) of drying the substrate front surface Wf and the substrate back surface Wb is executed.

As the substrate drying step is carried out, the controller 70 provides an operation command to the shut-off member ascend/descend mechanism 34 and the shut-off member rotation mechanism 33, the shut-off member 38 moves to the proximal position and the shut-off member 38 starts rotating.

Following this, the controller 70 provides an operation command to the stage rotation mechanism 22, and the rotation speed is changed. It is preferred that the rotation speed of the substrate W at the substrate drying step is 500 to 1000 rpm so that the solution on the substrate front surface Wf can be shaken off by centrifugal force arising from rotations of the substrate W.

In this condition, the dry gas is supplied to the substrate front surface Wf via the upper outer tubular nozzle 39 from the dry gas supply source 602 in accordance with an operation command from the controller 70. Further, the dry gas from the dry gas supply source 607 is supplied to the substrate back surface Wb from the opening of the stage 23 via the gas supply path 26 in accordance with an operation command from the controller 70.

As the substrate W rotates in accordance with rotations of the stage 23, the solution is shaken off outward from the periphery of the substrate W and removed from the substrate front surface Wf. In addition, the solution evaporates into the dry gas supplied to the substrate front surface Wf and the substrate back surface Wb, and is accordingly removed from the substrate front surface Wf.

In the event that there are fine patterns formed on the substrate front surface Wf as in the first embodiment, stress could act upon the patterns during drying of a liquid which fills the areas between the patterns owing to the surface tension of the liquid, the neighboring patterns could be pulled together as the liquid is dried, and the patterns could collapse.

In the first embodiment, the solution is IPA and is a liquid whose surface tension is relatively lower than that of pure water such as DIW. Hence, the stress applied upon the patterns formed on the substrate front surface Wf as the solution dries up is smaller than that on pure water, which makes it possible to dry the substrate favorably while preventing collapse of the patterns. That is, in the first embodiment, the solution functions as a remover liquid for removal of the hydrophobization film 802 and also as a rinse liquid for preventing collapse of the patterns during drying of the substrate front surface Wf.

The second liquid as well adhering to the substrate back surface Wb is removed during the substrate drying step. That is, as the substrate W rotates in accordance with rotations of the stage 23, the second liquid is shaken off outward from the periphery of the substrate W and removed from the substrate back surface Wb. In addition, the second liquid evaporates into the dry gas supplied to the substrate front surface Wf and the substrate back surface Wb, and is accordingly removed from the substrate back surface Wb.

After the solution and the second liquid adhering to the substrate W are removed at the substrate removing step, a substrate unloading step (Step S108) of unloading the substrate W from the cleaning unit 91a is executed.

As the substrate unloading step is carried out, the controller 70 provides an operation command to the shut-off member ascend/descend mechanism 34 and the shut-off member rotation mechanism 33, the shut-off member 38 moves to the distant position and the shut-off member 38 stops rotating.

Following this, the controller 70 provides an operation command to the stage rotation mechanism 22, the stage stops rotating and the stage 23 is set to a proper position for transfer of the substrate W. Meanwhile, the cup 101 is set to the home position. The chucks 24 are opened and the substrate W is then set on the support pins.

The shutter 911 is then opened, the center robot 96 stretches the upper hands 961 into inside the cleaning unit 91a, and the substrate W is transferred from the substrate holding unit 20 to the hands 961. After the hands 961 hold the substrate W, the substrate W is unloaded from the cleaning unit 91a and transferred onto the upper hands 951 of the shuttle 95. The shuttle 95 thereafter moves the upper hands 951 toward the indexer unit 93.

Using the upper hands 933, the indexer robot 931 takes out the substrate W held by the upper hands 951 of the shuttle 95 and inserts it to the predetermined position of the FOUP 949, the series of processing are completed.

As described above, in the first embodiment, after hydrophobization of the surfaces of the patterns ("the hydrophobization agent supplying step" of the invention) by supplying the hydrophobization gas which is vapor of the hydrophobization liquid which is obtained by mixing the solvent (IPA) and the hydrophobization agent (the silane coupling agent) to the substrate front surface Wf on which the patterns are formed, the dry gas is supplied, the solvent is removed from the substrate front surface Wf and the presence of the gas is ensured between the neighboring patterns ("the solvent removing step" of the invention), and after this, in a condition that the first liquid (DIW) is supplied to the substrate front surface Wf ("the one-principal surface liquid film forming step" of the invention), the ultrasonic wave-applied liquid (DIW as the second liquid+ ultrasonic waves) is supplied to the substrate back surface Wb, whereby the substrate back surface Wb is ultrasonically cleaned ("the cleaning step" of the invention).

Further, as described above, in the substrate cleaning apparatus according to the first embodiment, the hydrophobization gas supply source 601 which supplies the hydrophobization gas and the shut-off mechanism 30 including the upper outer tubular nozzle 39 function as "the hydrophobization agent supplier (hydrophobizer)" of the invention. When these structure elements function as the hydrophobization agent supplier, the upper outer tubular nozzle 39 serves as "the first nozzle."

Further, the first liquid supply source 603 which supplies the first liquid to the substrate front surface Wf (one principal surface), the shut-off mechanism 30 including the upper inner tubular nozzle 37 and the substrate holding unit 20 which rotates the substrate W work together and functions as "the one-principal surface liquid film former" of the invention. When these structure elements function as the one-principal surface liquid film former, the upper inner tubular nozzle 37 functions as "the second nozzle."

Further, the dry gas supply source 602 which supplies the dry gas and the shut-off mechanism 30 including the upper outer tubular nozzle 39 function as "the dry gas supplier," while the stage 23, the chucks 24 and the stage rotation mechanism 22 function as "the substrate rotator." "The dry gas supplier" and "the substrate rotator" correspond to "the solvent remover" of the invention. Meanwhile, the substrate holding unit 20 including the stage 23 and the chucks 24 function also as "the substrate holder" of the invention.

With the substrate cleaning apparatus and the substrate cleaning method described above, it is possible to prevent collapse and contamination of the patterns of the substrate front surface Wf during ultrasonic cleaning of the substrate back surface Wb. Further, it is not necessary to form a solid film or frozen film for preventing contamination of the patterns of the substrate front surface Wf, which makes it possible to reduce the consumption of the relatively costly chemical liquids except for pure water and process the substrate in an environment at an ordinary temperature without a cooling process. The invention thus attains the effect of reducing the apparatus costs and the substrate processing costs.

2. Second Embodiment

The substrate cleaning apparatus 9 according to the second embodiment and the substrate cleaning method using this apparatus will now be described with reference to FIG. 14. Except for the difference of the second embodiment from the first embodiment that the hydrophobization agent is supplied not from the shut-off mechanism 30 but at the nozzle 51 of the hydrophobization agent remover 50 in the cleaning unit 91, the other structure elements are the same, and therefore, the same structure elements will simply be denoted at the same reference symbols as those which are used for describing the first embodiment but will not be described again. For distinction from other embodiments, the cleaning unit 91 according to the second embodiment will be hereinafter referred to as "the cleaning unit 91b."

FIG. 14 is a drawing which schematically shows the structure of the cleaning unit 91b according to the second embodiment. As in the first embodiment, the hydrophobization agent remover 50 comprises the nozzle 51, the arm 52, the rotation axis 53 and the arm rotation mechanism 54. The solution supply source 606 is connected with the nozzle 51. The solution supply source 606 is a supply source which is electrically connected with the supply source controller 60 and supplies the solution to the nozzle 51 in accordance with an operation command from the supply source controller 60.

In the second embodiment, in addition to these, a hydrophobization liquid supply source 608 is connected with the nozzle 51. The hydrophobization liquid supply source 608 is a supply source which is electrically connected with the supply source controller 60 and supplies the hydrophobization liquid, which is the mixture of the hydrophobization agent and the solvent, to the nozzle 51 in accordance with an operation command from the supply source controller 60. The supply source controller 60 can control liquid supply from the solution supply source 606 and that from the hydrophobization liquid supply source 608 independently of each other. That is, the nozzle 51 discharges the solution or the hydrophobization liquid.

That is, in the second embodiment, the hydrophobization agent remover 50 functions as "the hydrophobization agent remover" which supplies the solution and accordingly removes the hydrophobization agent from the substrate front surface Wf, and serves also as "the hydrophobization agent supplier" which supplies the hydrophobization liquid to the substrate front surface Wf and accordingly supplies the hydrophobization agent.

Next, the operation of the substrate cleaning apparatus according to the second embodiment will be described. The flow chart in FIG. 10 will be referred to.

In the second embodiment, as the substrate cleaning operation is started, the same processing as that according to the first embodiment is carried out from the substrate loading step (S101) to the substrate holding/rotating step (S102).

Following this, as the hydrophobization agent supplying step (S103) is started, the controller 70 provides an operation command to the shut-off member ascend/descend mechanism 34 and the shut-off member rotation mechanism 33, the shut-off member 38 moves to the distant position and the shut-off member 38 stops rotating.

Following this, the controller 70 provides an operation command to the stage rotation mechanism 22, and the rotation speed is changed. It is desired that the rotation speed of the substrate W at the hydrophobization agent supplying step is set according to the scan speed, the scan count or the like of the nozzle 51 so that the nozzle 51 which discharges the hydrophobization liquid can entirely scan the substrate front surface Wf.

Next, the controller 70 provides an operation command to the arm rotation mechanism 54, and the nozzle 51 is set to the center position P11 from the retract position P14 (See FIG. 9.).

In this condition, the hydrophobization liquid is supplied to the substrate front surface Wf via the nozzle 51 from the hydrophobization liquid supply source 608 in accordance with an operation command from the controller 70. The hydrophobization liquid is supplied from a central area of the substrate front surface Wf to the periphery of the substrate W as the substrate W rotates in accordance with rotations of the stage 23. As a result, the hydrophobization film 802 (See the right-hand side section in FIG. 11) is formed on the surfaces of the patterns Wp of the substrate front surface Wf.

Meanwhile, the controller 70 provides an operation command to the arm rotation mechanism 54, and the nozzle 51 moves reciprocally for a predetermined number of times which may be one time or more than one times between the center position P11 and the peripheral position P13. This makes it possible to supply the hydrophobization liquid to the entire substrate front surface Wf and form the hydrophobization film 802 without fail on the substrate front surface Wf including an area between the neighboring patterns Wp.

Following this, as the solvent removing step (S104) is started, in a similar manner to the first embodiment, the dry gas is supplied to the substrate front surface Wf via the upper outer tubular nozzle 39 from the dry gas supply source 602 (FIG. 14), the hydrophobization liquid is shaken off as the substrate W rotates and the solvent evaporates into the dry gas, whereby the solvent is removed from the substrate front surface Wf and the gas is allowed to present between the patterns Wp. Similar processing to that according to the first embodiment is executed at and after the cleaning step so that the substrate back surface Wb is ultrasonically cleaned in a condition that the substrate front surface Wf is covered with the liquid film of the first liquid.

In the second embodiment, the hydrophobization liquid is supplied from the nozzle 51 which can be moved by the arm rotation mechanism 54 relative to the substrate W, and therefore, it is possible to supply the hydrophobization liquid to the entire substrate front surface Wf without any shortage. This securely prevents collapse of the patterns Wp owing to failed hydrophobization of some of the patterns Wp in the substrate front surface Wf.

3. Third Embodiment

The substrate cleaning apparatus 9 according to the third embodiment and the substrate cleaning method using this apparatus will now be described with reference to FIG. 15.

FIG. 15 is a drawing which schematically shows the structure of the cleaning unit 91 according to the third embodiment (hereinafter referred to as "the cleaning unit 91c"). The cleaning unit 91c of the substrate cleaning apparatus 9 according to the third embodiment comprises the shut-off mechanism 30 and the substrate holding unit 20 which are similar to those according to the first embodiment. The difference of the third embodiment from the first embodiment is the arrangement of the supply sources which are connected to these mechanisms and the structure of the ultrasonic wave-applied liquid supplier 40.

In the third embodiment, a rinse liquid supply source 609 which is a supply source for supplying a rinse liquid is connected with the upper inner tubular nozzle 37 of the shut-off mechanism 30 via the upper inner tube 36. The rinse liquid may be pure water such as DIW, IPA or the like which rinse the substrate W. In the third embodiment, DIW which is relatively less costly than IPA is used as the rinse liquid. The dry gas supply source 602 which is similar to that according to the first embodiment is connected with the upper outer tubular nozzle 39 of the shut-off mechanism 30.

Via the lower inner tube 25, a hydrophobization gas supply source 610 which is a supply source for supplying hydrophobization gas, a first liquid supply source 611 which is a supply source for supplying the first liquid and a solution supply source 612 which is a supply source for supplying the solution are connected with the lower nozzle 27 of the substrate holding unit 20. The hydrophobization gas supply source 610, the first liquid supply source 611 and the solution supply source 612 are each electrically connected with the supply source controller 60 and can discharge the respective liquids independently of each other from the lower nozzle 27 in accordance with an operation command from the supply source controller 60. The dry gas supply source 607 which is similar to that according to the first embodiment is connected with the gas supply path 26.

In the third embodiment, the substrate holding unit 20, when holding the substrate W with the chucks 24, directs the substrate back surface Wb toward above (Z direction) and makes the substrate front surface Wf opposed to the stage 23. That is, in a condition that the substrate front surface Wf on which the patterns is formed is directed toward the stage 23, the substrate W is horizontally held by the chucks 24.

The structure of the ultrasonic wave-applied liquid supplier 40 according to the third embodiment will now be described. As shown in FIG. 15, the ultrasonic wave-applied liquid supplier 40 comprises the ultrasonic nozzle 41 having the vibrator 42, the ultrasonic wave outputting mechanism 43, and the second liquid supply source 605 which is a supply source for supplying the second liquid to the ultrasonic nozzle 41. The ultrasonic wave-applied liquid supplier 40 further comprises the arm 45 which supports the ultrasonic nozzle 41, the rotation axis 46 connected with the arm 45, and the arm rotation mechanism 47 which rotates the rotation axis 46 about the central axis A2 which extends in the vertical direction.

The arm rotation mechanism 47 is electrically connected with the controller 70, and in accordance with an operation command from the controller 70, rotates the rotation axis 46 about the central axis A2. As the rotation axis 46 rotates, the arm 45 extending from the rotation axis 46 toward one direction within the XY plane rotates about the central axis A2 within the XY plane and the ultrasonic nozzle 41 revolves.

The ultrasonic wave-applied liquid supplier 40 further comprises, between the ultrasonic nozzle 41 and the arm 45, a direction adjustor (not shown) which can adjust the angle of the ultrasonic nozzle 41 with respect to the substrate W.

The operation of the ultrasonic nozzle 41 of the ultrasonic wave-applied liquid supplier 40 will now be described with reference to FIG. 16.

Figure 16:
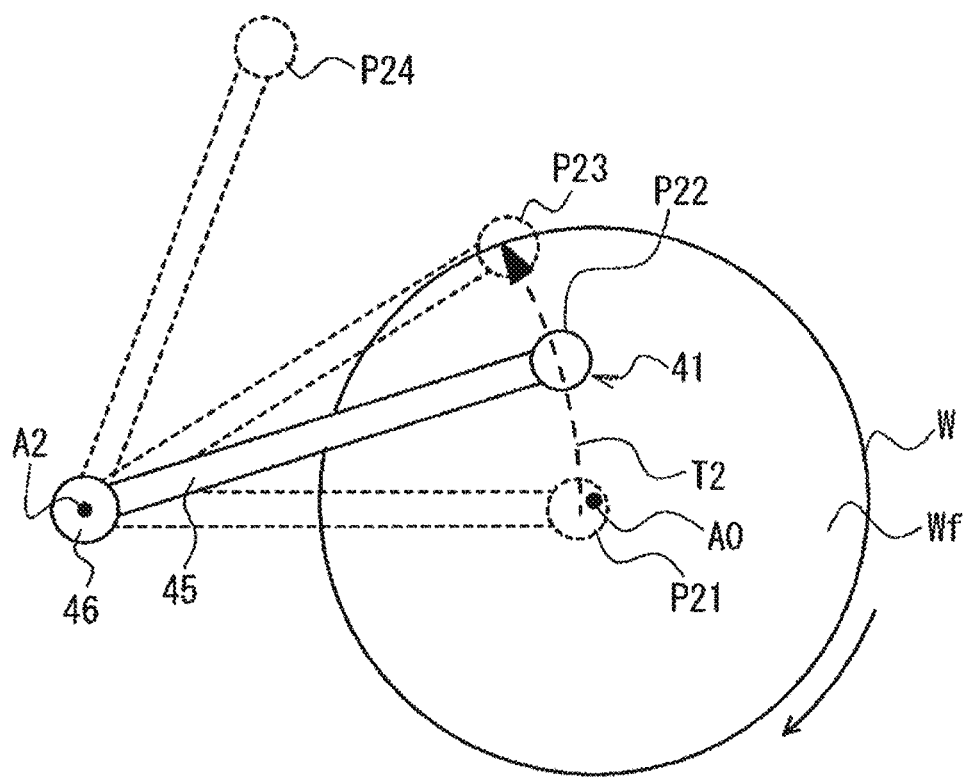
FIG. 16 is a drawing showing the operation of ultrasonic wave-applied liquid supplier.

FIG. 16 is a drawing which schematically shows the rotation action of the ultrasonic nozzle 41 about the central axis A2 and the positional relation of the ultrasonic nozzle 41 and the substrate W which is held by the substrate holding unit 20.

When the arm rotation mechanism 47 rotates the rotation axis 46 about the central axis A2 in accordance with an operation command from the controller 70, the arm 45 swings and the ultrasonic nozzle 41 moves along a trajectory T2 as it is opposed to the substrate back surface Wb of the substrate W which is held by the substrate holding unit 20.

The trajectory T2 is a trajectory from a center position P21 to a peripheral position P23 via a position P22.

The center position P21 is above the substrate W and approximately above the central axis A0, while the peripheral position P13 is above the exterior peripheral edge of the periphery of the substrate W. That is, the arm rotation mechanism 47 moves the ultrasonic nozzle 41 relative to the substrate W along the parallel direction to the substrate back surface Wb. Further, the ultrasonic nozzle 41 can also move to a retract position P24 which is on the extension line of the trajectory T2 but off to the side from the position opposed to the substrate W.

In addition, since the substrate W is rotated as the stage 23 rotates, as the arm rotation mechanism 47 swings the arm 45 in a condition that the stage 23 is made to rotate by the stage rotation mechanism 22, the ultrasonic nozzle 41 can be opposed to the entire surface of the substrate W sequentially, that is, the ultrasonic nozzle 41 can scan the entire surface of the substrate W.

The center position P21 may be a position which makes the second liquid or the ultrasonic wave-applied liquid discharged from the ultrasonic nozzle 41 reach a central area of the substrate W, and is set appropriately according to an incident angle θ1 described later. Therefore, the structure that it is approximately above the central axis A0 is not essential.

The ultrasonic nozzle 41 is opposed to the substrate W which is held by the substrate holding unit 20 with its back surface Wb directed toward above, and the discharge outlet of the ultrasonic nozzle 41 is at the angle of θ1 with respect to the substrate back surface Wb. The angle θ1 is the incident angle at which the ultrasonic wave-applied liquid discharged from the ultrasonic nozzle 41 arrives at the substrate back surface Wb, and is preferably not less than 75 and not more than 90.

FIG. 17 is a drawing which shows actual measurement values which represent the relationship between the incident angle θ1 and the size (sound pressure) of ultrasonic vibrations propagating to the other principal surface when the ultrasonic wave-applied liquid is supplied to one principal surface of the substrate W. A preferred value of the incident angle θ1 will be described with reference to FIG. 17.

In the measurement shown in FIG. 17, the ultrasonic wave-applied liquid whose ultrasonic output was 20 W was supplied to one principal surface of the substrate W at the flow rate of 1.5 L/m, and the sound pressure was measured using a hydrophone which was disposed at the other principal surface of the substrate W. In this manner, it was possible to measure the sound pressure which is applied to the substrate W itself. Thus measured sound pressure showed clear dependency upon the incident angle θ1. To be more specific, the sound pressure was maximum when the incident angle θ1=82.

During ultrasonic cleaning, the larger the sound pressure applied upon the substrate W is, more powerful the detergency is, and therefore, for excellent cleaning of the principal surface of the substrate W, the incident angle θ1 is preferably from 75 degrees to 90 degrees and more preferably 82 degrees according to the graph in FIG. 17.

From the above, the incident angle θ1 is 82 degrees in the third embodiment. However, since it is said that the optimal incident angle θ1 changes according to various conditions such as the shape of the ultrasonic nozzle 41 and ultrasonic vibration outputs, when one exercises the invention, incident angle θ1 is not limited to 82 degrees, one may measure per apparatus the incident angle θ1 at which the sound pressure becomes the greatest as shown in FIG. 17 and select the optimal incident angle θ1 per apparatus. This is why the direction adjustor (not shown), which can set the incident angle θ1 between 45 degrees and 90 degrees, is disposed between the ultrasonic nozzle 41 and the arm 45.

The operation of the substrate cleaning apparatus according to the third embodiment will now be described. The flow chart in FIG. 10 will be referred to.

As the substrate cleaning operation is started in the third embodiment, the substrate loading step (S101) and the substrate holding/rotating step (S102) are carried out with the front and the back of the substrate W directed in the opposite fashion to that in the first embodiment (i.e., in a condition that the substrate front surface Wf on which the patterns are formed directed toward below).

In the substrate holding/rotating step, the controller 70 provides an operation command to the stage rotation mechanism 22, the substrate starts rotating and the rotations are maintained until the subsequent hydrophobization agent supplying step. The rotation speed of the substrate W at the hydrophobization agent supplying step is preferably from 100 to 1000 rpm so that the hydrophobization gas supplied to the substrate front surface Wf can spread from the center to the periphery of the substrate W due to the centrifugal force which is created as the substrate W rotates.

Following this, as the hydrophobization agent supplying step (S103) is started, the controller 70 provides an operation command to the shut-off member ascend/descend mechanism 34 and the shut-off member rotation mechanism 33, the shut-off member 38 is kept at the distant position and the halt of the shut-off member 38 is maintained.

Next, in accordance with an operation command from the controller 70, the hydrophobization gas from the hydrophobization gas supply source 610 is supplied from the lower nozzle 27 to the substrate front surface Wf. As the substrate W rotates, the hydrophobization gas spreads from the center of the substrate W, which is where the lower nozzle 27 is generally located, to the periphery of the substrate W and is supplied to the entire substrate front surface Wf. The hydrophobization film 802 is consequently formed on the surfaces of the patterns Wp as in the first embodiment (See the right-hand side section in FIG. 11.)

After coating the surfaces of the patterns Wp with the hydrophobization film 802, the solvent removing step (S104) is initiated. First, in accordance with an operation command from the controller 70, the stage rotation mechanism 22 sets the rotation speed of the substrate W to 500 through 1000 rpm so as to shake off the first liquid, following this, the dry gas is supplied to the substrate front surface Wf from the dry gas supply source 607 via the gas supply path 26. This removes the solvent which is present between the neighboring patterns Wp and allows the gas to present there.

The cleaning step (S105) is then carried out. During the cleaning step, first, the stage rotation mechanism 22 sets the rotation speed of the substrate W to 100 through 1000 rpm in accordance with an operation command from the controller 70 so that the first liquid supplied to the substrate front surface Wf can spread from the center to the periphery of the substrate W due to the centrifugal force which is created as the substrate W rotates.

The first liquid is thereafter supplied to the substrate front surface Wf from the first liquid supply source 611 via the lower nozzle 27 in accordance with an operation command from the controller 70. Owing to the centrifugal force which is created as the substrate W rotates, the first liquid spreads from the center to the periphery of the substrate W, and the liquid film of the first liquid is formed on the substrate front surface Wf (the liquid film forming step).

The ultrasonic wave-applied liquid is supplied to the substrate back surface Wb from the ultrasonic nozzle 41 in this condition, and as the ultrasonic nozzle 41 revolves and scans the substrate back surface Wb, the entire substrate back substrate Wb is ultrasonically cleaned in a favorable manner. First, in accordance with an operation command from the controller 70, the ultrasonic nozzle 41 is set to the center position P21 (FIG. 16). The second liquid is then supplied to the substrate back surface Wb from the second liquid supply source 605 via the ultrasonic nozzle 41, and in this condition, as the pulse signal is outputted to the vibrator 42 from the ultrasonic wave outputting mechanism 43, the vibrator 42 ultrasonically vibrates and ultrasonic waves are applied upon the second liquid. The ultrasonic nozzle 41 thus discharges the ultrasonic wave-applied liquid.

With the ultrasonic nozzle 41 discharging the ultrasonic wave-applied liquid, the controller 70 provides an operation command to the arm rotation mechanism 47, thereby causing scanning one time or multiple times between the center position P21 and the peripheral position P23 and attaining ultrasonic cleaning of the substrate back surface Wb (the ultrasonic cleaning step).

At this stage, since the liquid film of the first liquid has already been formed on the substrate front surface Wf, it is possible to prevent contamination of the patterns on the substrate front surface Wf. In addition, the hydrophobization film 802 prevents the first liquid from penetrating into the areas between the patterns Wp, while the presence of the gas between the patterns Wp prevents collapse of the patterns which would otherwise occur because of ultrasonic waves which propagate from the substrate back surface Wb.

Further, in the third embodiment, since the substrate back surface Wb is directed toward above where there is a somewhat free space in a relative sense, the ultrasonic nozzle 41 which supplies the ultrasonic wave-applied liquid to the substrate back surface Wb can be disposed so that the ultrasonic nozzle 41 can perform scanning, thereby achieving favorable ultrasonic cleaning of the entire substrate back surface Wb.

As described above, in the substrate cleaning apparatus according to the third embodiment, the hydrophobization gas supply source 610 which supplies the hydrophobization gas and the substrate holding unit 20 which comprises the lower inner tube 25 and the lower nozzle 27 function as "the hydrophobization agent supplier (the hydrophobizer)" of the invention. When these structure elements function as the hydrophobization agent supplier, the lower nozzle 27 serves as "the third nozzle."

Further, the ultrasonic nozzle 41, which is disposed above the substrate W held by the substrate holding unit 20 and which supplies the ultrasonic wave-applied liquid to the substrate back surface Wb, functions as "the forth nozzle."

4. Modifications

The substrate cleaning apparatus and the substrate cleaning method according to the invention are not limited to the first through the third embodiments described above. Modifications of the invention will be described below.

<The Hydrophobization Gas and the Hydrophobization Agent>

FIG. 1 will be referred to. The first embodiment uses the hydrophobization gas for the purpose of hydrophobization of the surfaces of the patterns on the substrate front surface Wf. This may be replaced with a structure of direct supply without evaporation of the hydrophobization liquid. That is, the structure that the hydrophobization gas supply source 601 communicates with the upper outer tubular nozzle 39 may be replaced with a structure that the hydrophobization liquid supply source communicates with the upper inner tubular nozzle 37 and the hydrophobization liquid is supplied to the substrate front surface Wf from the upper inner tubular nozzle 37 at the hydrophobization agent supplying step.

This eliminates the necessity of disposing the hydrophobization gas supplier 120 shown in FIG. 8 as equipment and simplifies the structure of the apparatus, which delivers a benefit of reducing the costs of the apparatus.

Meanwhile, the hydrophobization liquid is supplied to the substrate front surface Wf from the nozzle 51 according to the second embodiment, this may be replaced with a structure of supplying hydrophobization gas. This is beneficial in that the amount of the hydrophobization liquid which needs be used are reduced, and therefore, the costs of the chemical solution and disposal of the waste liquid are reduced.

Further, although the hydrophobization gas is supplied to the substrate front surface Wf from the lower nozzle 27 in the third embodiment, this may be replaced with a structure of supplying the hydrophobization liquid. This eliminates the necessity of disposing the hydrophobization gas supplier 120 shown in FIG. 8 as equipment and simplifies the structure of the apparatus, which delivers a benefit of reducing the costs of the apparatus.

<Other Hydrophobization Methods>

While the first through the third embodiments described above require supplying of the hydrophobization liquid, which is the mixture of the hydrophobization agent in the solvent, or the hydrophobization gas to the substrate front surface Wf, this may be replaced with a structure that the solvent is first supplied to the substrate front surface Wf, followed by supplying of the hydrophobization agent, so as to mix the hydrophobization agent and the solvent on the substrate front surface Wf. Alternatively, the hydrophobization agent may be supplied to the substrate front surface Wf, followed by supplying of only a necessary amount of the solvent (that is, after adjusting the amount so as not to completely wash away the hydrophobization agent from the substrate front surface Wf), thereby mixing the hydrophobization agent and the solvent on the substrate front surface Wf.

Alternatively, in a condition that the substrate front surface Wf is coated with the gas-like hydrophobization agent, the substrate front surface Wf may be irradiated with high energy such as plasma which activates the reaction groups of the hydrophobization agent to thereby hydrophobize the surfaces of the patterns on the substrate front surface Wf. This structure makes it possible to hydrophobize the surfaces of the patterns without using the solvent and allow for the presence of the gas between the neighboring patterns without executing the solvent removing step. Therefore, there is a benefit that it is possible to reduce the number of process steps and shorten the time demanded by the substrate processing.

<Addition of the Substrate Heater>

The cleaning units 91 according to the first through the third embodiments may each comprise a substrate heater which heats the substrate W. The substrate heater may have a structure that a resistance heater is disposed inside the stage 23, an electric current is supplied to the resistance heater, and the substrate W held by the chucks 24 is heated via the stage 23. Alternatively, a gas heater may be disposed to the dry gas supply source which supplies the dry gas to the substrate front surface Wf or the substrate back surface Wb, and in a condition that the temperature of the dry gas is higher than the ordinary temperature (which may for instance be 60 degrees Celsius), the dry gas may be supplied to the substrate front surface Wf or the substrate back surface Wb to heat the substrate W.

Addition of the substrate heaters can realize other structures for "the solvent removing step" and "the hydrophobization agent removing step" as described below.

<Other Structure for the Solvent Removing Step>

In the first through the third embodiments, at the solvent removing step, the solvent is evaporated by supplying the dry gas to the substrate W, and shaken off by the centrifugal force which is created as the substrate W rotates, and the solvent is removed from the substrate front surface Wf. Instead of this or in addition to this, the substrate heaters which heat the substrate W may be newly comprised, and the solvent may be heated and evaporated by heating the substrate W, to thereby remove the solvent from the substrate front surface Wf.

In addition to supplying of the dry gas and rotations of the substrate, the solvent is removed through heating of the substrate, which attains a benefit that the time required for the solvent removing step is shortened.

In the event that the hydrophobizing capability of the hydrophobization agent adhering to the substrate front surface Wf improves through heating as described in JP-A-2014-197571, inclusion of a substrate heating step in the solvent removing step makes it possible to simultaneously execute an activation of hydrophobizing capability of the hydrophobization agent. This attains a benefit that it is possible to prevent the first liquid from penetrating into the areas between the patterns without fail at the subsequent cleaning step and more reliably prevent collapse of the patterns.

In this case, after the solvent removing step but before the cleaning step, a heating step may be performed as a separate step from the solvent removing step, to thereby facilitate the activation of hydrophobizing capability of the hydrophobization agent (the hydrophobization film 802) adhering to the substrate front surface Wf.

Alternatively, as the solvent removing step, the substrate W may be left still for a predetermined period of time and the solvent may be removed as it naturally dries without supplying the dry gas to the substrate W, rotating the substrate W or heating the substrate W.

<Other Structure of the Hydrophobization Agent Removing Step>

In the first through the third embodiments, at the hydrophobization agent removing step, the hydrophobization agent is removed from the substrate front surface Wf by supplying the solution. Instead of this, in the event that the hydrophobization agent is a substance which is thermally decomposed, evaporated or sublimated when heated, substrate heaters which heat the substrate W may be added and the substrate W may be heated at the hydrophobization agent removing step, to thereby remove the hydrophobization agent from the substrate front surface Wf using thermal decomposition, etc. This is advantageous in that it is possible to reduce the consumed amount of the chemical solutions since the solution is not necessary. Further, since it is possible to dry and remove the first liquid and the second liquid from the substrate front surface Wf and the substrate back surface Wb through heating and since the heating step serves also as the hydrophobization agent removing step and the substrate drying step, there is an advantage that the processing time is shorter.

<Experiment Results>

As described above, after hydrophobization of the surfaces of the patterns formed on one principal surface of the substrate, in a condition that there is the liquid film on one principal surface of the substrate including the surfaces of the patterns, the presence of the gas between the neighboring patterns prevents impact upon the patterns which is caused by ultrasonic waves during ultrasonic cleaning of the other principal surface and therefore it is possible to prevent collapse of the patterns. The inventors conducted experiments and verified that hydrophobization of the surfaces of the patterns made it possible to prevent collapse of the patterns even when the liquid film was formed and ultrasonic cleaning was executed subsequently.

Figure 18:
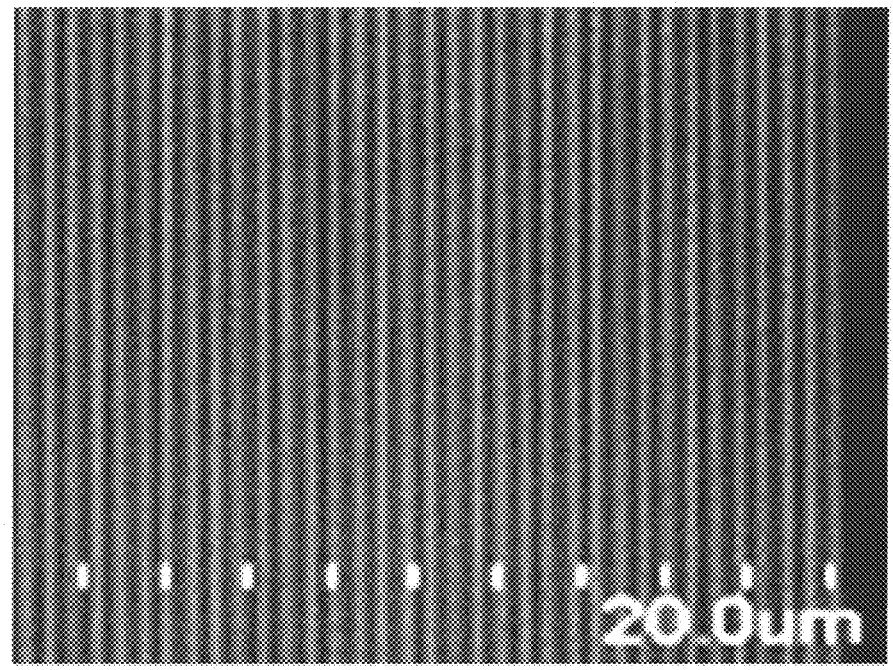
FIG. 18 is a drawing showing the experimental result of ultrasonic cleaning after hydrophobization.
Figure 19:
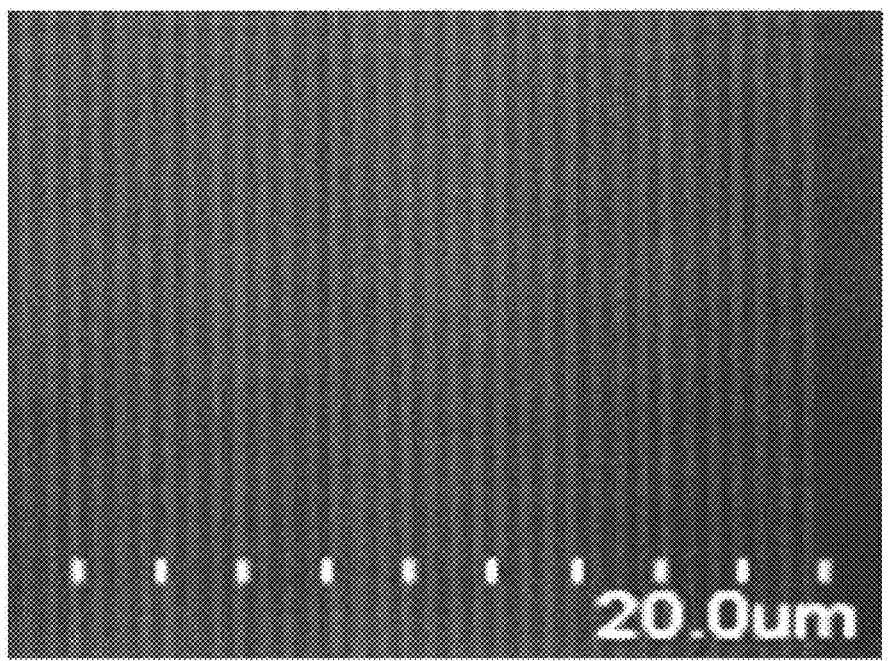
FIG. 19 is a drawing showing the results of the comparison experiments of FIG. 18.

FIG. 18 shows the result of the verification experiment with hydrophobization, and FIGS. 19 through 21 show the results of the comparison experiments with hydrophilization. Hydrophobization in this context means a condition that the contact angle of the principal surface of the substrate W with respect to DIW is 30 degrees or more, and the verification experiment shown in FIG. 18 is the result when the contact angle was approximately 40 degrees. Hydrophilization in this context means a condition that the contact angle of the principal surface of the substrate W with respect to DIW is smaller than 30 degrees, and the comparison experiments in FIGS. 19 through 21 were the results when the contact angle was approximately 10 degrees.

The procedures of the experiments will be described next. Out of substrates, which have same type of patterns (having the width of 37 nm) formed on one principal surfaces, one substrate was hydrophobized and the other substrates were hydrophilized. Next, one principal surfaces of the substrates were directed toward above, and in conditions that liquid films of DIW whose dissolved gas concentration of nitrogen gas were 0.02 ppm, 3 ppm and 18 ppm (saturation) were formed, the ultrasonic nozzle supplied the ultrasonic wave-applied liquid to the other principal surfaces. The substrates were then dried, the patterns of the substrates were observed with SEM, and the images in FIGS. 18 through 21 were obtained.

FIGS. 19, 20 and 21 show the SEM images which were obtained under the condition that the dissolved gas concentrations in the DIW liquid films formed on one principal surfaces were 0.02 ppm, 3 ppm and 18 ppm respectively. As shown in FIG. 21, under the condition that the dissolved gas concentration was high, generation and collapse of air bubbles attributed to application of ultrasonic waves was remarkable, and as the impact applied upon the patterns increased, the patterns collapsed significantly. Further, as the proof that collapse of the patterns occurred during cleaning of the substrates but not during drying of the substrates, FIGS. 20 and 21 show that the lower the dissolved gas concentration of the DIW liquid film becomes, that is, more suppressed generation and collapse of air bubbles attributed to application of ultrasonic waves becomes, the magnitude of collapse of the patterns decreases.

In contrast, it was verified that collapse of the patterns of the substrates which were hydrophobized did not occur under any one of the dissolved gas concentration conditions, and that even despite generation and collapse of air bubbles attributed to application of ultrasonic waves, hydrophobization made it possible to prevent collapse of the patterns during ultrasonic cleaning. FIG. 18 shows the result when the dissolved gas concentration was 18 ppm. As shown in FIG. 18, the patterns of the substrate did not occur.

With this, the inventors clearly showed that hydrophobization of the surfaces of the patterns made it possible to prevent collapse of the patterns even when the liquid films were formed later and ultrasonic cleaning was performed.

As described above with reference to the particular embodiments, the invention may be as described below.

A substrate cleaning method according to a first aspect of the invention comprises: a hydrophobization step of hydrophobizing surfaces of patterns formed on one principal surface of a substrate; an one-principal surface liquid film forming step of forming a liquid film of a first liquid on one principal surface after the hydrophobization step; and a cleaning step of cleaning the other principal surface of the substrate by supplying an ultrasonic wave-applied liquid, which is obtained by applying ultrasonic waves upon a second liquid, to the other principal surface in a condition that one principal surface is covered with the liquid film.

A substrate cleaning method according to a second aspect of the invention depends from the substrate cleaning method of the first aspect of the invention, wherein the hydrophobization step includes a hydrophobization agent supplying step of supplying a hydrophobization agent, which hydrophobizes the patterns, to one principal surface.

A substrate cleaning method according to a third aspect of the invention depends from the substrate cleaning method of the second aspect of the invention, wherein at the hydrophobization agent supplying step, a hydrophobization liquid which is a mixture of the hydrophobization agent and a solvent or hydrophobization gas which is vapor of the hydrophobization liquid is supplied to one principal surface.

A substrate cleaning method according to a fourth aspect of the invention depends from the substrate cleaning method of the third aspect of the invention, wherein the hydrophobization step includes a solvent removing step of removing the solvent from one principal surface after supplying the hydrophobization liquid or the hydrophobization gas to one principal surface.

A substrate cleaning method according to a fifth aspect of the invention depends from the substrate cleaning method of the fourth aspect of the invention, further comprises a hydrophobization agent removing step of removing the hydrophobization agent adhering to one principal surface after the cleaning step.

A substrate cleaning method according to a sixth aspect of the invention depends from the substrate cleaning method of the fifth aspect of the invention, wherein at the hydrophobization agent removing step, a solution for dissolving the hydrophobization agent is supplied to one principal surface, and a liquid having the same composition as the solvent is used as the solution.

A substrate cleaning method according to a seventh aspect of the invention depends from the substrate cleaning method of the first aspect of the invention, wherein the first liquid and the second liquid are the same processing liquid.

A substrate cleaning method according to an eighth aspect of the invention depends from the substrate cleaning method of the seventh aspect of the invention, wherein the processing liquid has a dissolved gas concentration which is saturated to a reservoir atmosphere which is the atmosphere inside a reservoir which stores the processing liquid.

A substrate cleaning apparatus according to a ninth aspect of the invention comprises: a hydrophobizer which hydrophobizes surfaces of the patterns formed on one principal surface of a substrate; an one-principal surface liquid film former which supplies a first liquid to one principal surface and forms a liquid film of the first liquid; an ultrasonic wave-applied liquid supplier which supplies an ultrasonic wave-applied liquid, which is obtained by applying ultrasonic waves upon a second liquid, to the other principal surface of the substrate; and a controller which controls the hydrophobizer, the one-principal surface liquid film former and the ultrasonic wave-applied liquid supplier, wherein the controller has a memory part which stores a program for executing a cleaning operation in which after hydrophobization of the surfaces of the patterns by the hydrophobizer, in a condition that the one-principal surface liquid film former has covered one principal surface with the liquid film, the ultrasonic wave-applied liquid supplier supplies the ultrasonic wave-applied liquid to the other principal surface and the other principal surface is cleaned.

A substrate cleaning apparatus according to a tenth aspect of the invention depends from the substrate cleaning method of the ninth aspect of the invention, wherein the hydrophobizer has a hydrophobization agent supplier which supplies a hydrophobization agent which hydrophobizes the patterns to one principal surface.

A substrate cleaning apparatus according to a eleventh aspect of the invention depends from the substrate cleaning method of the tenth aspect of the invention, wherein the hydrophobization agent supplier supplies a hydrophobization liquid which is a mixture of the hydrophobization agent and a solvent or hydrophobization gas which is vapor of the hydrophobization liquid to one principal surface.

A substrate cleaning apparatus according to a twelfth aspect of the invention depends from the substrate cleaning method of the eleventh aspect of the invention, further comprises a solvent remover which removes the solvent from one principal surface.

A substrate cleaning apparatus according to a thirteenth aspect of the invention depends from the substrate cleaning method of the twelfth aspect of the invention, further comprises a substrate holder which holds the substrate horizontally in such a manner that one principal surface or the other principal surface is directed toward above.

A substrate cleaning apparatus according to a fourteenth aspect of the invention depends from the substrate cleaning method of the thirteenth aspect of the invention, wherein the hydrophobization agent supplier has a first nozzle which is disposed above the substrate, and from the first nozzle, the hydrophobization liquid or the hydrophobization gas is supplied to one principal surface of the substrate which is held by the substrate holder with one principal surface directed toward above.

A substrate cleaning apparatus according to a fifteenth aspect of the invention depends from the substrate cleaning method of the fourteenth aspect of the invention, further comprises a shut-off member which is disposed above and opposed to the substrate which is held by the substrate holder with one principal surface directed toward above, wherein the shut-off member has a substrate-facing surface which is opposed to one principal surface, and the first nozzle is disposed to the substrate-facing surface of the shut-off member.

A substrate cleaning apparatus according to a sixteenth aspect of the invention depends from the substrate cleaning method of the thirteenth aspect of the invention, wherein the one-principal surface liquid film former has a second nozzle which is disposed above the substrate, and from the second nozzle, the first liquid is supplied to one principal surface of the substrate which is held by the substrate holder with one principal surface directed toward above.

A substrate cleaning apparatus according to a seventeenth aspect of the invention depends from the substrate cleaning method of the thirteenth aspect of the invention, wherein the substrate holder has a stage, which holds the substrate with the other principal surface directed toward above and is opposed to one principal surface of the substrate at a predetermined distance, and a plurality of holders which are disposed to the stage and hold the periphery of the substrate, and the hydrophobization agent supplier has a third nozzle which is disposed to the stage, and supplies the hydrophobization liquid or the hydrophobization gas to one principal surface from the third nozzle.

A substrate cleaning apparatus according to a eighteenth aspect of the invention depends from the substrate cleaning method of the seventeenth aspect of the invention, wherein the ultrasonic wave-applied liquid supplier has a fourth nozzle which is disposed above the substrate, and the ultrasonic wave-applied liquid is supplied to the other principal surface from the fourth nozzle.

A substrate cleaning apparatus according to a nineteenth aspect of the invention depends from the substrate cleaning method of the eighteenth aspect of the invention, further comprised a fourth nozzle movement mechanism which moves the fourth nozzle relative to the substrate.

A substrate cleaning apparatus according to a twentieth aspect of the invention depends from the substrate cleaning method of the twelfth aspect of the invention, further comprises a hydrophobization agent remover which removes the hydrophobization agent adhering to one principal surface.

The invention is generally applicable to any cleaning technique for ultrasonically cleaning the substrate on which the patterns are formed and to a substrate cleaning method and a substrate cleaning apparatus which are for performing so-called ultrasonic cleaning to the substrate using this cleaning technique.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:
1. A substrate cleaning apparatus comprising:
  a hydrophobizer which hydrophobizes surfaces of patterns formed on one principal surface of a substrate;
  a one-principal surface liquid film former which supplies a first liquid to the one principal surface and forms a liquid film of the first liquid;
  an ultrasonic wave-applied liquid supplier which supplies an ultrasonic wave-applied liquid, which is obtained by applying ultrasonic waves upon a second liquid, to another principal surface of the substrate;
  a substrate holder which holds the substrate horizontally with the other principal surface directed upward and having a stage opposed to the one principal surface of the substrate; and
  a controller which controls the hydrophobizer, the one-principal surface liquid film former and the ultrasonic wave-applied liquid supplier,
  wherein the stage has an opening forming a lower nozzle,
  the hydrophobizer has a hydrophobization agent supplier which supplies a hydrophobization agent which hydrophobizes the patterns to the the one principal surface,
  the hydrophobization agent supplier supplies a hydrophobization liquid which is a mixture of the hydrophobization agent and a solvent or hydrophobization gas which is vapor of the hydrophobization liquid to the one principal surface from the lower nozzle, the one-principal surface liquid film former supplies the first liquid from the lower nozzle, the ultrasonic wave-applied liquid supplier has an ultrasonic nozzle which is disposed above the substrate, and the ultrasonic wave-applied liquid is supplied to the other principal surface from the ultrasonic nozzle, the controller has a memory which stores a program for executing a cleaning operation in which after hydrophobization of the surfaces of the patterns by the hydrophobizer, in a condition that the one-principal surface liquid film former has covered one principal surface with the liquid film, the ultrasonic wave-applied liquid supplier supplies the ultrasonic wave-applied liquid to the other principal surface and the other principal surface is cleaned.

2. The substrate cleaning apparatus of claim 1, further comprising a solvent remover which removes the solvent from one principal surface.

3. The substrate cleaning apparatus of claim 2, further comprising a hydrophobization agent remover which removes the hydrophobization agent adhering to one principal surface.

4. The substrate cleaning apparatus of claim 1, wherein the hydrophobization agent supplier has a first nozzle which is disposed above the substrate, and from the first nozzle, the hydrophobization liquid or the hydrophobization gas is supplied to one principal surface of the substrate which is held by the substrate holder with one principal surface directed toward above.

5. The substrate cleaning apparatus of claim 4, further comprising a shut-off member which is disposed above and opposed to the substrate which is held by the substrate holder with one principal surface directed toward above, wherein the shut-off member has a substrate-facing surface which is opposed to one principal surface, and
the first nozzle is disposed to the substrate-facing surface of the shut-off member.

6. The substrate cleaning apparatus of claim 1, wherein the one-principal surface liquid film former has a second nozzle which is disposed above the substrate, and from the second nozzle, the first liquid is supplied to one principal surface of the substrate which is held by the substrate holder with one principal surface directed toward above.

7. The substrate cleaning apparatus of claim 1, wherein the substrate holder has a plurality of holders which are disposed to the stage and hold the periphery of the substrate.

8. The substrate cleaning apparatus of claim 1, further comprising an ultrasonic nozzle movement mechanism which moves the ultrasonic nozzle relative to the substrate.

* * * * *